(12) United States Patent
Nozawa et al.

(10) Patent No.: US 8,383,519 B2
(45) Date of Patent: Feb. 26, 2013

(54) ETCHING METHOD AND RECORDING MEDIUM

(75) Inventors: Toshihisa Nozawa, Amagasaki (JP);
Kotaro Miyatani, Nirasaki (JP);
Toshiyasu Hori, Nirasaki (JP);
Shigekazu Hirose, Nirasaki (JP)

(73) Assignee: Tokyo Electron Limited (JP)

(*) Notice: Subject to any disclaimer, the term of this patent is extended or adjusted under 35 U.S.C. 154(b) by 715 days.

(21) Appl. No.: 12/526,471

(22) PCT Filed: Feb. 5, 2008

(86) PCT No.: PCT/JP2008/051862
§ 371 (c)(1),
(2), (4) Date: Aug. 7, 2009

(87) PCT Pub. No.: WO2008/096752
PCT Pub. Date: Aug. 14, 2008

(65) Prior Publication Data
US 2010/0279510 A1 Nov. 4, 2010

(30) Foreign Application Priority Data

Feb. 9, 2007 (JP) .................. 2007-031162
May 8, 2007 (JP) .................. 2007-123820

(51) Int. Cl.
*H01L 21/302* (2006.01)
*H01L 21/461* (2006.01)
(52) U.S. Cl. .................. 438/706; 216/81
(58) Field of Classification Search .............. 216/81, 216/67; 438/706, 710
See application file for complete search history.

(56) References Cited

FOREIGN PATENT DOCUMENTS

| EP | 1146555 A1 | * 10/2001 |
|---|---|---|
| JP | 4-067655 | 3/1992 |
| JP | 2004-530287 | 9/2004 |
| JP | 2005-123406 | 5/2005 |
| JP | 2005-223360 | 8/2005 |
| JP | 2006-128591 | 5/2006 |
| JP | 2006-165189 | 6/2006 |
| JP | 2006-302924 | 11/2006 |
| WO | 98/21745 | 5/1998 |
| WO | 00/54329 | 9/2000 |

OTHER PUBLICATIONS

Notice of Grounds of Rejection-Japanese Patent Application No. 2007-123820 issued on Oct. 25, 2011, citing WO00/54329 and previously submitted JP2005-123406.
Notice of Preliminary Rejection-Korean Application No. 10-2009-7014154 issued Oct. 25, 2011, citing KR1999-77239(WO98/21745 is the family application of Korea Patent Publication No. 1999-77239) and previously submitted KR2005-123406.
Japanese Office Action—Japanese Application No. 2007-123820 issued on Jul. 26, 2011, citing JP 2006-128591, JP 2006-165189, and JP 2005-123406.
International Search Report of PCT/JP2008/051862 dated May 13, 2008.

* cited by examiner

*Primary Examiner* — Roberts Culbert
(74) *Attorney, Agent, or Firm* — Cantor Colburn LLP

(57) ABSTRACT

An etching method by which a fluorine-added carbon film formed on a substrate is etched by plasma includes a first step of etching the fluorine-added carbon film with plasma of an oxygen-containing processing gas, and a second step of etching the fluorine-added carbon film with plasma of a fluorine-containing processing gas.

9 Claims, 32 Drawing Sheets

Exfoliation·Void

US 8,383,519 B2

ETCHING METHOD AND RECORDING MEDIUM

TECHNICAL FIELD

The present invention relates to an etching method by which a fluorine-added carbon film formed on a substrate, such as a semiconductor substrate, is etched by plasma, and a recording medium having a program for performing the etching method, recorded thereon.

BACKGROUND ART

A multi-layer wiring structure is employed so as to implement highly-integrated semiconductor devices. In order to constitute the multi-layer wiring structure, adjacent wiring layers are connected by a conductive layer, and regions other than the conductive layer need to be insulated by an interlayer dielectric film. Conventionally, $SiO_2$ layer is widely used as the interlayer dielectric film. However, in these days, in order to reduce the capacity between wiring layers so as to manufacture fine and high-speed semiconductor devices, the interlayer dielectric film needs to have low permittivity.

As the interlayer dielectric film having low permittivity, a fluorine-added carbon film (fluoro carbon film: $CF_x$ film) that is a compound of carbon (C) and fluorine (F) has been highlighted. Relative permittivity of 2.5 or less for the fluorine-added carbon film may be attained by selecting the type of a raw material gas in contrast with the $SiO_2$ layer having relative permittivity of about 4. Thus, the fluorine-added carbon film is very effective for obtaining an interlayer dielectric film having low permittivity. Recently, a chemical vapor deposition (CVD) apparatus that generates plasma with low electron temperature by selecting a raw material gas or with high density has been developed so that a better layer can be obtained and will be put to practical use.

As a method of etching the fluorine-added carbon film, a method by which a hydrogen gas and a nitrogen gas are plasmatized and the fluorine-added carbon film is etched by using plasma of the hydrogen gas and the nitrogen gas, has been known (Materials Research Society Conference Proceedings, Volume V-14, Advanced Metallization Conference in 1998). However, when the above method is performed, hydrogen is introduced into side wall portions of the etched fluorine-added carbon film and is combined with fluorine in the fluorine-added carbon film, so that hydrogen fluoride can be generated and the fluorine-added carbon film may be damaged. In addition, in a following process, a barrier metal layer is formed in an etched recess portion, or metal is buried therein. However, if hydrogen fluoride is generated, the barrier metal layer or metal is corroded and damaged, and thus, an adhesiveness of the fluorine-added carbon film and the barrier metal layer or metal to each other is degraded.

In order to solve the problem, a technology for etching a fluorine-added carbon film by using plasma of a process gas including a $C_xF_y$ (where x and y are natural numbers) gas, such as a $CF_4$ gas, has been suggested (Japanese Laid-open Patent Publication No. 2005-123406). Thus, the fluorine-added carbon film can be etched with low damage.

However, if the fluorine-added carbon film is etched by using a $C_xF_y$-containing gas, such as a $CF_4$ gas, an etching selectivity with respect to a hard mask layer, such as SiN or SiCN, used as an etching mask, is low, and the shape of processing the fluorine-added carbon film is not good.

DISCLOSURE OF THE INVENTION

To solve the above and/or other problems, the present invention provides an etching method by which a fluorine-added carbon film is etched in a better processing shape while the fluorine-added carbon film is not damaged. The present invention also provides a recording medium having a program for performing the etching method, recorded thereon.

According to an aspect of the present invention, there is provided an etching method by which a fluorine-added carbon film formed on a substrate is etched by plasma, the etching method including: a first step of etching the fluorine-added carbon film with plasma of an oxygen-containing processing gas; and a second step of etching the fluorine-added carbon film with plasma of a fluorine-containing processing gas.

According to another aspect of the present invention, there is provided an etching method by which a structure in which a fluorine-added carbon film, a hard mask layer and a resist film are sequentially stacked on a semiconductor substrate, is etched, the etching method including: etching the hard mask layer with plasma by using the resist film as a mask; removing the resist film by plasma; and etching the fluorine-added carbon film with plasma by using the hard mask layer as the mask, wherein the etching of the fluorine-added carbon film includes: a first step of etching the fluorine-added carbon film with plasma of an oxygen-containing processing gas; and a second step of etching the fluorine-added carbon film with plasma of a fluorine-containing processing gas.

The hard mask layer may be formed of a silicon (Si)-based material, and when the hard mask layer is etched, plasma of a processing gas comprising a $C_xF_y$ (where x and y are natural numbers) gas may be used.

After the hard mask layer is etched halfway, the resist film may be removed, and subsequently, the hard mask layer may be etched to expose the fluorine-added carbon film.

According to another aspect of the present invention, there is provided an etching method by which a fluorine-added carbon film of a structure in which a copper (Cu) wiring layer and the fluorine-added carbon film are sequentially formed on a semiconductor substrate, is etched, the etching method including: performing first etching on the fluorine-added carbon film by using an etching mask; forming a silicon-based coating film on the fluorine-added carbon film to fill an etched portion of the fluorine-added carbon film after the first etching is performed; forming an etching mask on the silicon-based coating film and performing second etching on the fluorine-added carbon film by using the etching mask; and removing the silicon-based coating film, wherein the above operations are performed so that trenches and vias that reach a position corresponding to the Cu wiring layer are formed in the fluorine-added carbon film, and wherein the first etching and the second etching each include: a first step of etching the fluorine-added carbon film with plasma of an oxygen-containing processing gas; and a second step of etching the fluorine-added carbon film with plasma of a fluorine-containing processing gas.

Before the forming the silicon-based coating film, the method may further include coating a wetting property enhancement surface reforming material on a surface of the fluorine-added carbon film after the first etching is performed, the wetting property enhancement surface reforming material reforming the surface of the fluorine-added carbon film to enhance a wetting property between the fluorine-added carbon film and the silicon-based coating film and to obtain a better close-adhesion property thereof. In this case, acetone may be used as the wetting property enhancement surface reforming material.

The method may further include, after the trenches and the vias are formed, coating a fluorine separation inhibition surface reforming material on a surface of inner walls of the fluorine-added carbon film, the fluorine separation inhibition surface reforming material reforming the surface of the fluorine-added carbon film to inhibit the amount of fluorine from the fluorine-added carbon film. In this case, ethanol or methanol may be used as the fluorine separation inhibition surface reforming material.

The method may further include, after the trenches and the vias are formed so that the Cu wiring layer is exposed, removing a native oxide film formed on the surface of the Cu wiring layer by supplying ammonia water to the surface of the Cu wiring layer.

In this case, a concentration of ammonia of the ammonia water may be 0.25 wt % to 5 wt %, and a temperature of the ammonia water may be 0° C. to 30° C.

The trenches may be formed by the first etching, and the vias may be formed by the second etching.

A processing gas including oxygen used in the first step of etching the fluorine-added carbon film may include an $O_2$ gas. The processing gas including the $O_2$ gas may be an $O_2$ gas, or a gas consisting of the $O_2$ gas and a rare gas. The first step of etching the fluorine-added carbon film may be performed at pressure of 13.3 Pa (100 mTorr) or less.

A processing gas including fluorine used in the second step of etching the fluorine-added carbon film may include a $C_xF_y$ (where x and y are natural numbers) gas. In this case, the processing gas including fluorine used in the second step of etching the fluorine-added carbon film may be a $C_xF_y$ gas (where x and y are natural numbers), or a gas consisting of the $C_xF_y$ (where x and y are natural numbers) gas and a rare gas. In addition, the $C_xF_y$ (where x and y are natural numbers) gas may include at least one of the group consisting of a $CF_4$ gas, a $C_2F_6$ gas, a $C_3F_6$ gas, a $C_4F_6$ gas, a $C_3F_8$ gas, a $C_4F_8$ gas, and $C_5F_8$ gas.

The etching of the fluorine-added carbon film may be performed between the first step and the second step of etching the fluorine-added carbon film while maintaining a vacuum state (while a substrate is not exposed to air). In this case, the first step and the second step of etching the fluorine-added carbon film may be performed in one processing container, or the first step and the second step of etching the fluorine-added carbon film may be performed in different processing containers, and a substrate may be transferred between the processing containers while maintaining a vacuum state.

The etching of the fluorine-added carbon film may be performed by capacitively-coupled plasma or by plasma generated by microwaves radiated from a planar antenna which may have a plurality of slots.

According to another aspect of the present invention, there is provided a recording medium having a program recorded thereon, the program operating on a computer and controlling a plasma processing apparatus, wherein the control program controls the plasma processing apparatus on the computer so that the etching method of the above aspects of the present invention is performed when the control program is executed.

According to the present invention, the fluorine-added carbon film is etched by a first step of performing etching with plasma of an oxygen-containing processing gas, generally, an $O_2$ gas-containing gas, and by a second step of performing etching with plasma of a fluorine-containing process gas, generally, a $C_xF_y$ (where x and y are natural numbers) gas. Thus, in the first step, etching having a high selectivity with respect to a mask can be performed by the oxygen-containing processing gas so that a better shape forming property can be obtained, and oxygen that remains on an etched surface of the fluorine-added carbon film due to the first step of etching can be removed in the second step of etching so that a better surface shape of the fluorine-added carbon film after etching of the fluorine-added carbon film is terminated can be formed.

BEST MODE FOR CARRYING OUT THE INVENTION

Embodiments of the present invention will now be described with reference to the accompanying drawings.

Figure 1:
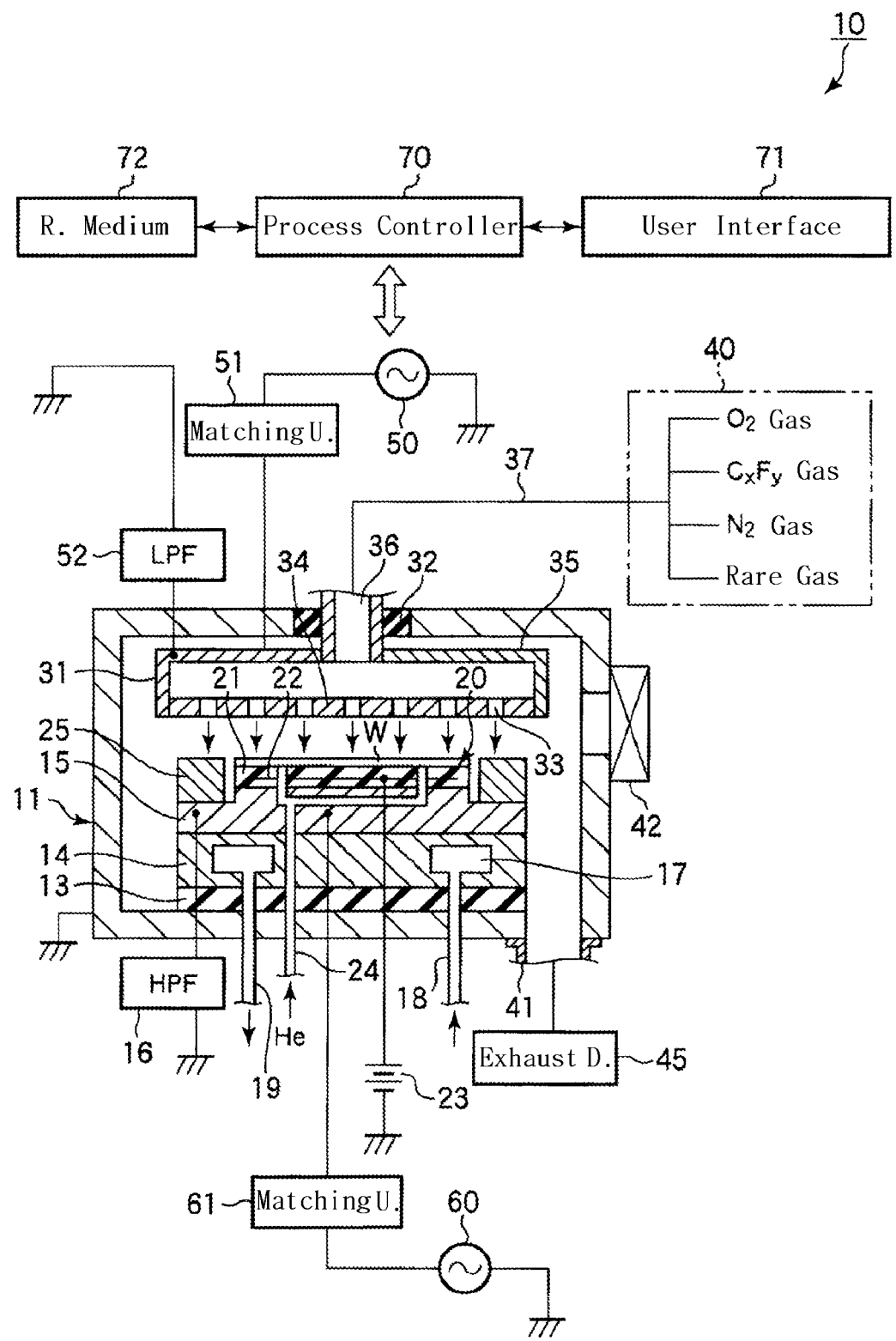
FIG. 1 is a cross-sectional view of a plasma processing apparatus in which an etching method according to the present invention can be performed, according to an embodiment of the present invention.

FIG. 1 is a cross-sectional view of a plasma processing apparatus 10 in which an etching method according to an embodiment of the present invention can be performed. The plasma processing apparatus has a structure in which capacity-coupled plasma is generated by a pair of parallel flat electrodes, which face each other in a vertical direction.

As illustrated in FIG. 1, the plasma processing apparatus 10 includes a processing chamber 11 that is formed to have approximately a cylindrical shape. A susceptor support 14 is installed on a bottom of the processing chamber 11 using an insulating plate 13, which is interposed between the susceptor support 14 and the bottom of the processing chamber 11, and a susceptor 15 is disposed on the susceptor support 14. The susceptor 15 also functions as a lower electrode, and a semiconductor wafer W is held on the susceptor 15 via an electrostatic chuck 20. Reference numeral 16 denotes a high pass filter (HPF).

A refrigerant chamber 17 in which a cooling medium of a predetermined temperature is circulated, is formed in the susceptor support 14, and thus, the temperature of the susceptor 15 is controlled to a desired temperature. An introduction pipe 18 and a discharge pipe 19 are connected to the refrigerant chamber 17. A refrigerant is circulated so that the temperature of processing the semiconductor wafer W that is held on the susceptor 15 can be controlled.

The electrostatic chuck 20 has a structure in which an electrode 22 is disposed between insulators 21, and a direct current (DC) voltage is applied to the electrode 22 from a DC power supply source 23 so that the semiconductor wafer W is electrostatically absorbed on the electrostatic chuck 20. A heat transfer gas formed of a He gas is supplied to a back side of the semiconductor wafer W via a gas path 24, and the temperature of the semiconductor wafer W is controlled to a predetermined temperature due to the heat transfer gas. A ring-shaped focus ring 25 is disposed in a circumferential part of a top end of the susceptor 15 so as to surround the circumference of the semiconductor wafer W that is held on the electrostatic chuck 20 so that uniformity of etching is enhanced.

An upper electrode 31 is disposed above the susceptor 15 and is supported in an inside of the processing chamber 11 via insulators 32, wherein the upper electrode 31 and the susceptor 15 face each other. The upper electrode 31 includes an electrode plate 34 having a plurality of ejection holes 33 and an electrode support 35 supporting the electrode plate 34, and forms a shower shape.

A gas introduction hole 36 is formed in the center of the electrode support 35, and a gas supply pipe 37 is connected to the gas introduction hole 36. The gas supply pipe 37 is connected to a processing gas supply unit 40 that supplies a processing gas for plasma processing. A processing gas supply source supplying an $O_2$ gas, a $C_xF_y$ gas such as a $CF_4$ gas, a $N_2$ gas, or a rare gas such as an Ar gas is provided in the processing gas supply unit 40, and the processing gas can be supplied to the inside of the processing chamber 11 at a predetermined flow rate.

An exhaust pipe 41 is connected to the bottom of the processing chamber 11, and an exhaust device 45 is connected to the exhaust pipe 41. The exhaust device 45 includes a vacuum pump such as a turbo molecular pump, and a pressure control valve, and sets the inside of the processing chamber 11 to a predetermined depressurization atmosphere. A gate valve 42 is installed in side wall portions of the processing chamber 11.

A first high-frequency power supply source 50 that supplies high-frequency power for generating plasma via a first matching unit 51, is connected to the upper electrode 31. A frequency of the first high-frequency power supply source 50 in the range of 27 to 100 MHz is used. In addition, a low pass filter (LPF) 52 is connected to the upper electrode 31. A second high-frequency power supply source 60 that drags ions in plasma via a second matching unit 61, is connected to the susceptor 15 that functions as a lower electrode. A frequency of the second high-frequency power supply source 60 in the range of 300 kHz to 13.56 MHz, for example, is used.

The plasma processing apparatus 10 includes a process controller 70 that is a microprocessor (computer) that controls elements of the plasma processing apparatus 10, and the elements of the plasma processing apparatus 10 are controlled while being connected to the process controller 70. In addition, a keyboard with which an operator inputs commands so as to manage the plasma processing apparatus 10, or a user interface 71 that is a display displaying a state where the plasma processing apparatus 10 operates, is connected to the process controller 70.

In addition, a recording unit 72 having a control program in which various processes to be performed by the plasma processing apparatus 10 are performed by control of the process controller 70, or a program for performing the processes on the elements of the plasma processing apparatus 10 according to processing conditions, i.e., a recipe recorded thereon, is connected to the process controller 70. The recipe is recorded on a recording medium in the recording unit 72. The recording medium may be a hard disk, a semiconductor memory, or a portable medium such as a CD-ROM, DVD, or flash memory. In addition, the recipe may be appropriately transmitted to the process controller 70 from another device, for example, via a dedicated line.

As occasion demands, a recipe may be called from the recording unit 72 according to an instruction from the user interface 71 to be executed by the process controller 70 so that desired processing can be performed by the plasma processing apparatus 10 under the control of the process controller 70.

Figure 2:
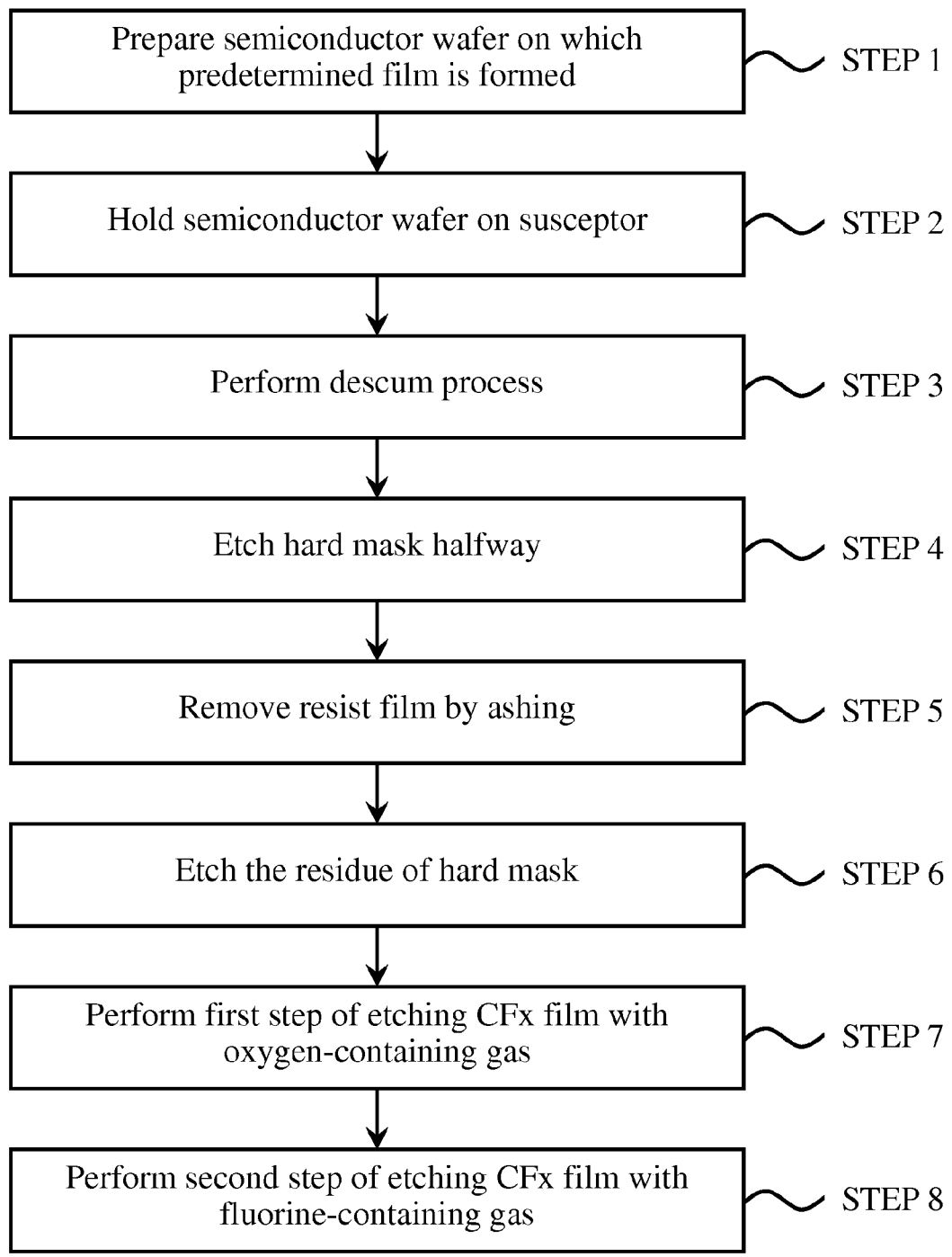
FIG. 2 is a flowchart illustrating an etching method according to an embodiment of the present invention.

Next, a plasma etching method, which is to be performed by the plasma processing apparatus 10, according to an embodiment of the present invention will be described with reference to a flowchart of FIG. 2 and a cross-sectional view of FIG. 3.

Figure 3A:
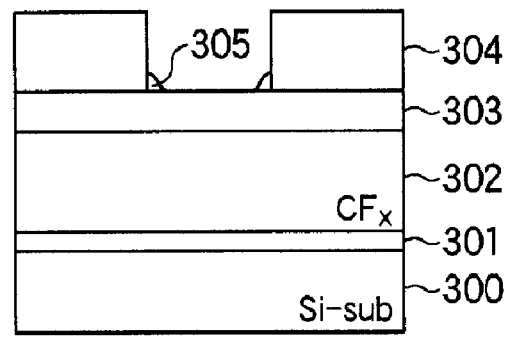
FIGS. 3A through 3G are cross-sectional views illustrating processes of the etching method shown in FIG. 3.

First, referring to FIG. 3A, the semiconductor wafer W having a structure in which an etching stopper layer 301 made of SiCN, for example, is formed on a silicon substrate 300 to a thickness of 10 nm, for example, a fluorine-added carbon film ($CF_x$-film) 302 is formed on the etching stopper layer 301 to a thickness of 270 nm, for example, a hard mask layer 303 made of a Si-containing material, for example, SiCN, is formed on the $CF_x$ film 302 to a thickness of 30 nm, for example, a resist film 304 made of a KrF resist, for example, is formed on the hard mask layer 303 to a thickness of 400 nm, for example, sequentially in the order and patterns are formed in the resist film 304 by a photolithography process, is prepared (step 1).

Figure 3B:
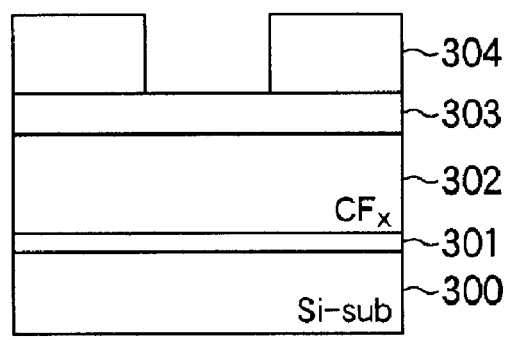

Subsequently, the semiconductor wafer W having the above structure is carried into the plasma processing apparatus 10 of FIG. 1 and is held on the susceptor 15 (step 2). Referring to FIG. 3B, a descum process is performed on an after development residue 305 that remains by development processing of the photolithography process (step 3). In the descum process, an Ar gas and an $O_2$ gas, for example, are used as a processing gas, and the Ar gas and an $O_2$ gas are flown at flow rates of 135 mL/min(sccm) and 65 mL/min (sccm), respectively, and pressure inside the processing chamber 11 is set to 1.33 Pa (10 mTorr) and high-frequency power to be applied to the upper electrode 31 is set to 500 W and high-frequency power to be applied to the lower electrode is set to 200 W.

Figure 3C:
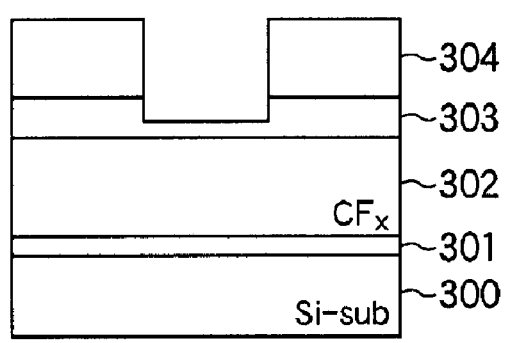

After the descum process is performed, referring to FIG. 3C, the hard mask layer 303 is etched halfway by using the resist film 304 as an etching mask (step 4). In the etching process, an $N_2$ gas and a $CF_4$ gas, for example, are used as a processing gas, and the $N_2$ gas and the $CF_4$ gas are flown at a flow rate of 20 to 200 mL/min(sccm), for example, at a flow rate of 30 mL/min(sccm), and at a flow rate of 60 to 200 mL/min(sccm), for example, at a flow rate of 90 mL/min (sccm), respectively, and pressure inside the processing chamber 11 is set to 1.33 to 13.3 Pa (10 to 100 mTorr), for example, 6 Pa (45 mTorr) and high-frequency power to be applied to the upper electrode 31 is set to 0.8 to 1.8 W/cm², for example, 1.6 W/cm², and high-frequency power to be applied to the lower electrode is set to 0.18 to 0.45 W/cm², for example, 0.22 W/cm².

Figure 3D:
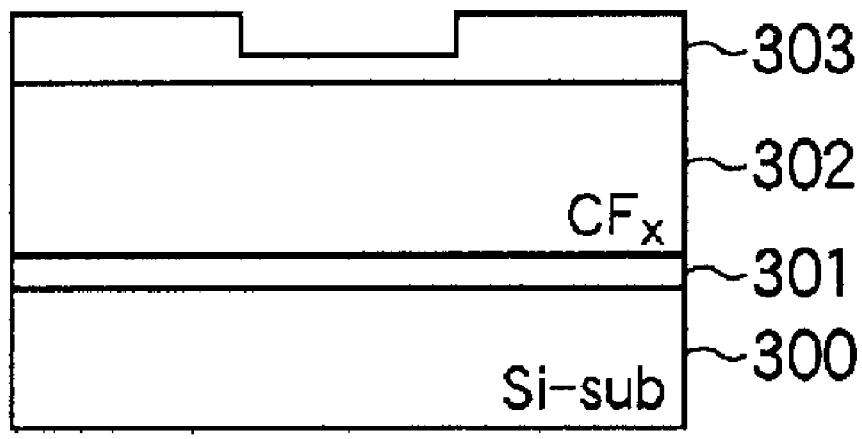

Referring to FIG. 3D, when the thickness of the hard mask layer 303 is about 1/5 to about 1/3 of its original thickness, etching of the hard mask layer 303 is stopped, and an $O_2$ gas is used as a processing gas, and the resist film 304 is removed by ashing (step 5). In the ashing process, an $O_2$ gas is flown at a flow rate of 100 to 500 mL/min(sccm), for example, at a flow rate of 300 mL/min(sccm), and pressure inside the processing chamber 11 is set to 0.67 to 6.7 Pa (5 to 50 mTorr), for example, 1.3 Pa (10 mTorr) and high-frequency power to be applied to the upper electrode 31 is set to 0.3 to 1.8 W/cm², for example, 0.37 W/cm² and high-frequency power to be applied to the lower electrode is set to 0.04 to 0.4 W/cm², for example, 0.14 W/cm².

Figure 3E:
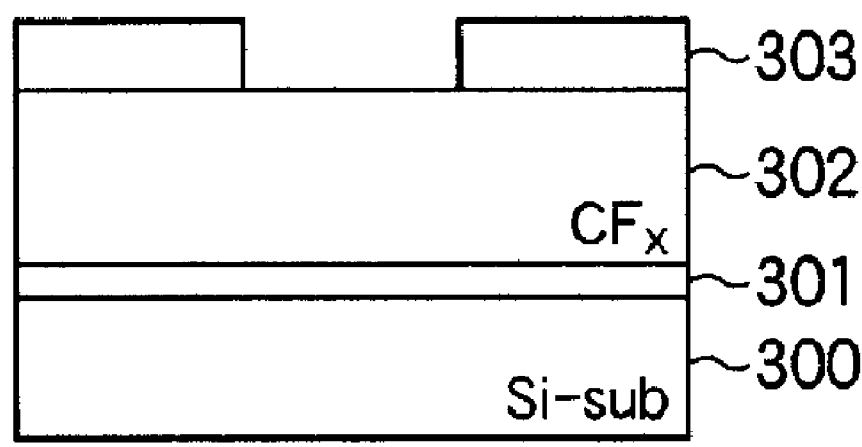

After the resist film 304 is removed by ashing, referring to FIG. 3E, etching of the hard mask layer 303 is performed again under the same conditions as those of step 4, and the hard mask layer 303 is perforated to expose the $CF_x$ film 302 (step 6).

Figure 3F:
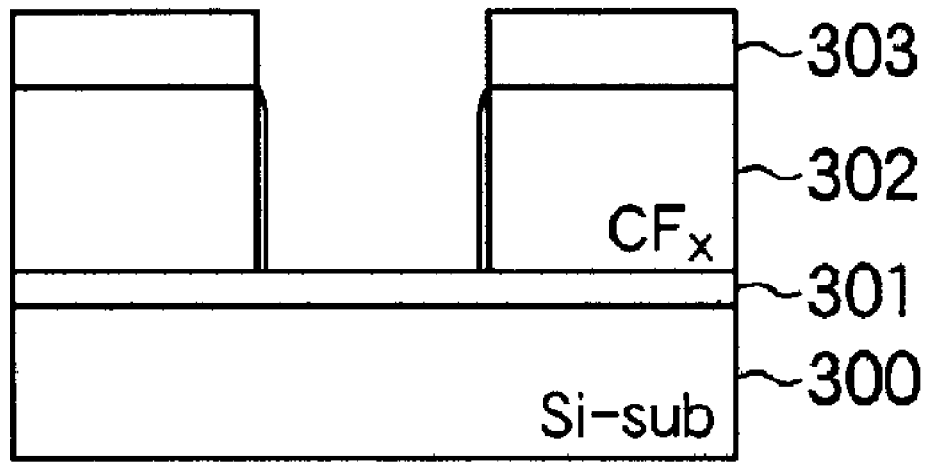
Figure 3G:
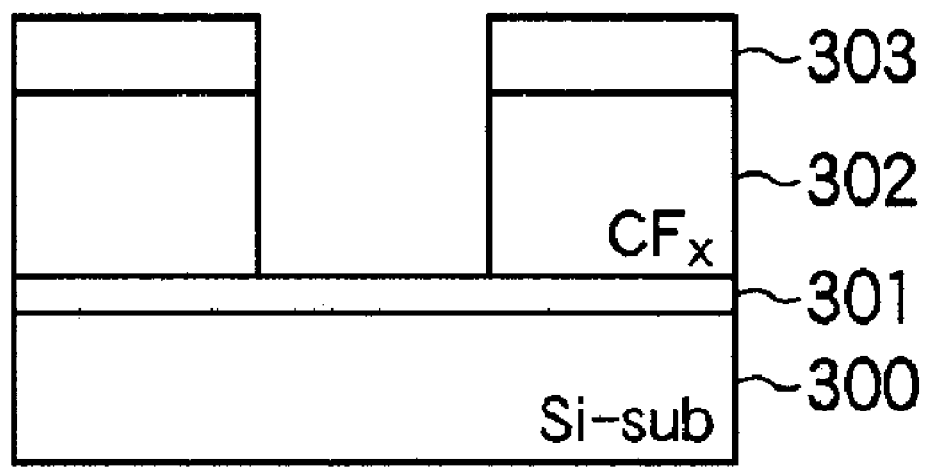

Next, referring to FIG. 3F, a first step of etching the $CF_x$ film 302 is performed by using the hard mask layer 303 as an etching mask (step 7). The etching process is performed by using an oxygen-containing gas, generally, by using an $O_2$ gas-containing gas as a processing gas. Only the $O_2$ gas may be used, and an Ar gas may be added to the $O_2$ gas so as to generate stable plasma. In this case, the flow rate of the $O_2$ gas is set to 40 to 150 mL/min(sccm), for example, 65 mL/min (sccm), and the flow rate of the Ar gas is set to 80 to 300 mL/min(sccm), for example, 135 mL/min(sccm), and pressure inside the processing chamber 11 is set to low pressure of less than 13.3 Pa (100 mTorr) or less, and may be set to 6.7 Pa (50 mTorr) or less, for example, 1.3 Pa (10 mTorr), and high-frequency power to be applied to the upper electrode 31 is set to 0.4 to 1.7 W/cm², for example, 0.62 W/cm², and high-frequency power to be applied to the lower electrode is set to 0.2 to 0.55 W/cm², for example, 0.4 W/cm² under low radical conditions. In this way, the first step of etching the $CF_x$ film 302 is performed by using an oxygen-containing gas, generally, an $O_2$-containing gas so that a selectivity with respect to the hard mask layer 303 formed of an Si-containing material can be improved and a better etching shape of the $CF_x$ film 302 can be formed. When etching by a $C_xF_y$ gas disclosed in Japanese Laid-open Patent Publication No. 2005-123406 is performed, since a sufficient selectivity with respect to a Si-containing hard mask layer such as SiCN or SiN that is usually used in the related art is not obtained, a shape forming property is not good, but a better shape forming property can be obtained by etching using an oxygen-containing gas.

However, since the first step of etching the $CF_x$ film 302 is performed by using the oxygen-containing gas, oxygen remains on an etched surface of the $CF_x$ film 302, and when a metal layer is formed later, the $CF_x$ film 302 may be oxidized. Thus, after the first step of etching the $CF_x$ film 302 is performed by using the oxygen-containing gas, referring to FIG. 3G, a second step of etching the $CF_x$ film 302 is performed by using a fluorine-containing gas, generally, gas containing gas indicated by $C_xF_y$ (where x and y are natural numbers) (step 8). In this case, only the $C_xF_y$ gas may be used, and a rare gas, for example, an Ar gas may be added to the $C_xF_y$ gas. The second step of etching the $CF_x$ film 302 may be performed to a very small thickness so that a surface on which oxygen remains after the first step of etching the $CF_x$ film 302 is terminated can be removed. The gas indicated by $C_xF_y$ may be at least one of the group consisting of a $CF_4$ gas, a $C_2F_6$ gas, a $C_3F_6$ gas, a $C_4F_6$ gas, a $C_3F_8$ gas, a $C_4F_8$ gas, and $C_5F_8$ gas. The second step of etching the $CF_x$ film 302 is performed under conditions of etching; as a $C_xF_y$ gas (where x and y are natural numbers) that is a fluorine-containing gas, for example, a $CF_4$ gas is supplied at a flow rate of 100 to 400 mL/min(sccm), for example, at a flow rate of 100 mL/min (sccm), and pressure inside the processing chamber 11 is set to 0.67 to 5.3 Pa (5 to 40 mTorr), for example, 1.3 Pa (10 mTorr), and high-frequency power to be applied to the upper electrode 31 is set to 0.4 to 0.9 W/cm$^2$, for example, 0.62 W/cm$^2$, and a bias voltage to be applied to the lower electrode is set to 0 to 20 W/cm$^2$, and the bias voltage may not be applied thereto so as to prevent the CF$_x$ film 302 from being damaged. As a processing gas, a rare gas such as an Ar gas may be included as a dilution gas.

By performing the above-described processes, etching of the CF$_x$ film 302 is terminated. In this way, etching of the CF$_x$ film 302 is performed with two steps, that is, the first step of etching the CF$_x$ film 302 using the oxygen-containing gas and the second step of etching the CF$_x$ film 302 using the fluorine-containing gas so that, in the first step of etching the CF$_x$ film 302, low-damage etching with a high selectivity with respect to a mask and a better shape forming property can be performed and in the second step of etching the CF$_x$ film 302, a very thin portion in which a large amount of oxygen that remains on an etched surface of the CF$_x$ film 302 due to the oxygen-containing gas is contained, is removed by the fluorine-containing gas and a better surface shape can be formed. Thus, etching of the CF$_x$ film 302 with a better shape forming property and a better surface shape can be performed.

In addition, in the first step and second step of etching the CF$_x$ film 302, the temperature of the susceptor 15 may be 10° C. to 30° C., and a gap between the upper electrode 31 and the lower electrode may be 30 to 60 mm.

In the above examples, a series of processes are preformed in one processing chamber, but one or a plurality of processes may be performed in different chambers. As a result, the number of changing gas or the number of purge is reduced so as to enhance throughput. In this case, the semiconductor wafer W may be transferred to a plurality of processing chambers while maintaining a vacuum state. In particular, a vacuum state needs to be maintained when the first and second steps of etching the CF$_x$ film 302 are performed.

Figure 4:
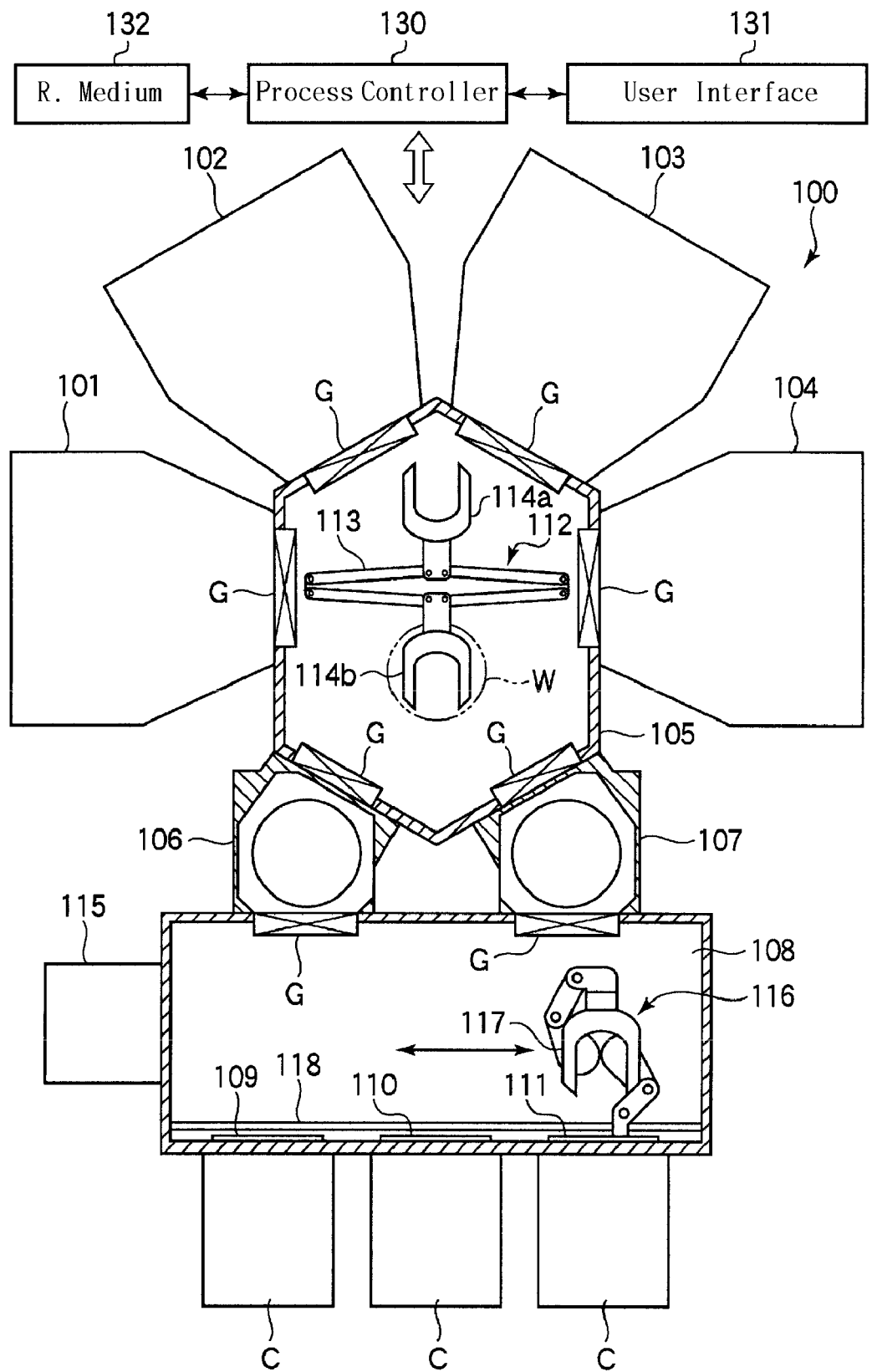
FIG. 4 is a plan view of a cluster tool type processing system in which the etching method according to the present invention can be performed.

In this way, a cluster tool type processing system 100 shown in FIG. 4 is very appropriate to a system for performing processes by transferring the semiconductor wafer W while maintaining a vacuum state among the plurality of processing chambers. Referring to FIG. 4, the processing system 100 includes four processing units 101, 102, 103, and 104, and each of the processing units 101, 102, 103, and 104 corresponds to four sides of a transfer chamber 105 that forms a hexagon. In addition, loadlock chambers 106 and 107 are arranged at the other two sides of the transfer chamber 105. A carrying in/out chamber 108 is disposed at a side of the loadlock chambers 106 and 107, which is opposite side to the transfer chamber 105, and ports 109, 110, and 111 that attach three carriers C in which a semiconductor substrate (semiconductor wafer W) can be accommodated, are formed on a side of the carrying in/out chamber 108, which is opposite side to the loadlock chambers 106 and 107.

As illustrated in FIG. 4, the processing units 101, 102, 103, and 104 and the loadlock chambers 106 and 107 are connected to the each side of the transfer chamber 105 via gate valves G, communicate with the transfer chamber 105 when the gate valves G corresponding to the processing units 101, 102, 103, and 104 and the loadlock chambers 106 and 107 are opened, and are blocked from the transfer chamber 105 when the gate valves G are closed. In addition, the gate valve G is disposed in a side of the loadlock chambers 106 and 107 connected to the carrying in/out chamber 108, and the loadlock chambers 106 and 107 communicate with the carrying in/out chamber 108 when the gate valves G are opened and are blocked from the carrying in/out chamber 108 when the gate valves G are closed.

With respect to the processing units 101, 102, 103, and 104 and the loadlock chambers 106 and 107, a wafer transfer device 112 is installed in the transfer chamber 105 to carry into and carry out of the semiconductor substrate W. The wafer transfer chamber 112 is installed approximately in the center of the transfer chamber 105 and includes two blades 114a and 114b that support the semiconductor wafer W on a front end of a rotation•extension portion 113 that can be rotated and extended, and the two blades 114a and 114b are attached to the rotation•extension portion 113 to be directed toward opposite directions. In addition, the transfer chamber 105 is maintained at a predetermined vacuum level.

Shutters (not shown) are provided at the three ports 109, 110, and 111 of the carrying in/out chamber 108, which attach the three carriers C, and when the carriers C in which the semiconductor wafer W is accommodated or the carriers C in which the semiconductor wafer W is not accommodated are directly attached to the ports 109, 110, and 111, the shutters open and communicate with the carrying in/out chamber 108 while preventing the air from entering the ports 109, 110, and 111. In addition, an alignment chamber 115 is disposed at a side surface of the carrying in/out chamber 108, and alignment of the semiconductor substrate W is performed in the alignment chamber 115.

A transfer device 116 is installed in the carrying in/out chamber 108 so as to carry the semiconductor wafer W in or out of the carriers C and carry the semiconductor wafer W in or out of the loadlock chambers 106 and 107. The transfer device 116 has a multi-joint arm structure and travels on a rail 118 along a direction in which the carriers C are arranged, and thus, places the semiconductor wafer W on a hand 117 positioned at a front end of the transfer device 116 and transfers the semiconductor wafer W.

The processing system 100 includes a process controller 130 that is a microprocessor (computer) that controls elements of the processing system 100, i.e., processing units or a transfer system and a gas supply system of the processing system 100, and the elements of the processing system 100 are controlled while being connected to the process controller 130. A user interface 131 and a recording unit 132 are connected to the process controller 130. The process controller 130, the user interface 131, and the recording unit 132 have the same configuration as that of the process controller 70, the user interface 71, and the recording unit 72.

In the processing system 100, some of all processes are performed by using any of the processing units 101, 102, 103, and 104, and the other processes are performed by using another one or two or more processing units. For example, the descum process of the step 3, the process of etching the hard mask layer 303 of the steps 4 and 6, and the ashing process of the step 5 may be performed by using one processing unit, the first step of etching the CF$_x$ film 302 may be performed by using still another processing unit, and the second step of etching the CF$_x$ film 302 may be performed by using another processing unit. In this case, since the semiconductor wafer W is transferred by the transfer device 112 in the transfer chamber 105 that is maintained in a vacuum state, even though some processes are performed in different processing chambers, the semiconductor wafer W may be transferred while maintaining a vacuum state, and thus, an etched portion of the CF$_x$ film 302 may be prevented from being oxidized.

Figure 5:
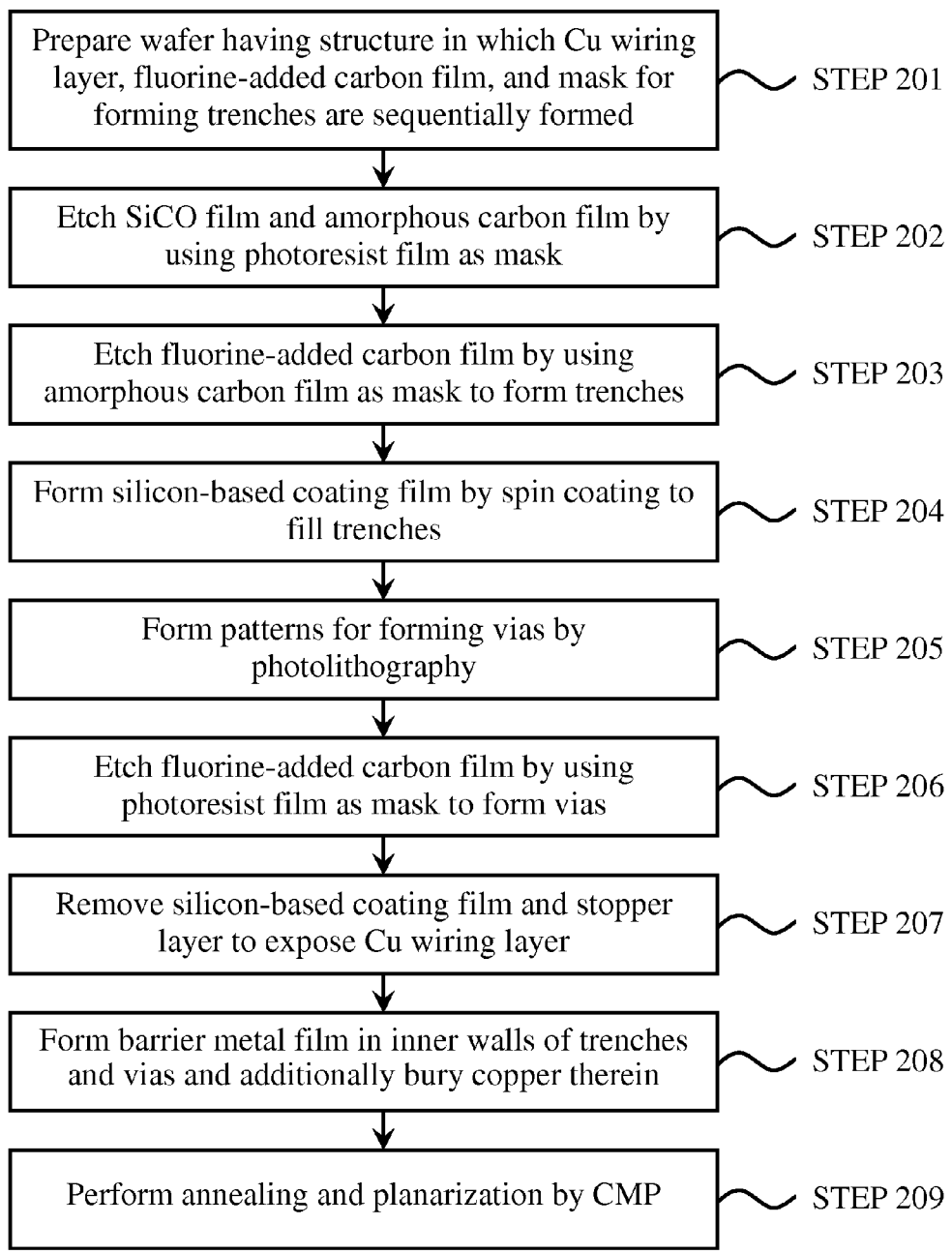
FIG. 5 is a flowchart illustrating an example in which a fluorine-added carbon film is used as a Low-k layer and the etching method according to the present invention is applied to a damascene process.

Next, an example in which a fluorine-added carbon film is used as a low permittivity interlayer dielectric film (Low-k layer) and the etching method according to the present invention is applied to a damascene process will be described. FIG. 5 is a flowchart illustrating the example in which a fluorine-added carbon film is used as a low permittivity interlayer dielectric film (Low-k layer) and the etching method according to the present invention is applied to a damascene process, and FIG. 6 is a cross-sectional view of processes illustrated in the flowchart of FIG. 5.

Figure 6A:
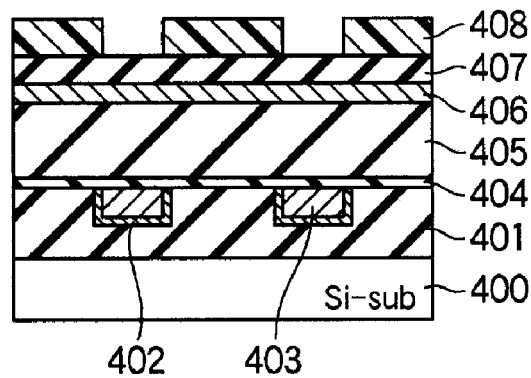
FIGS. 6A through 6H are cross-sectional views of processes illustrated in the flowchart of FIG. 5.
Figure 6B:
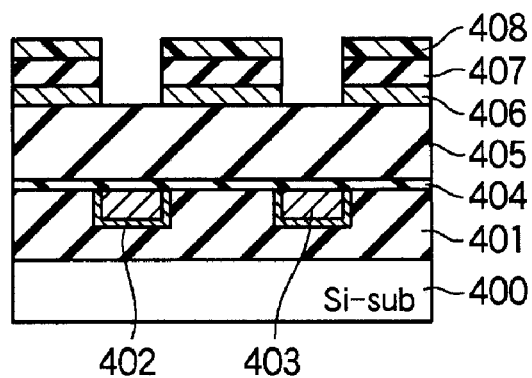

First, a semiconductor wafer W having a structure in which an insulating layer 401 is formed on a Si substrate 400, a Cu wiring layer 403 is formed at an upper portion inside the insulating layer 401 via a barrier metal layer 402, a stopper layer (for example, a SiN film or SiC film) 404 is formed on the insulating layer 401 and the Cu wiring layer 403, a fluorine-added carbon film 405 as a Low-k film is formed on the stopper layer 404, an amorphous carbon film 406, a SiCO film 407, and a photoresist film 408 are sequentially formed on the fluorine-added carbon film 405 and patterns for forming trenches 409 are formed in the photoresist film 408 by a photolithography process, is prepared (step 201, FIG. 6A).

Figure 6C:
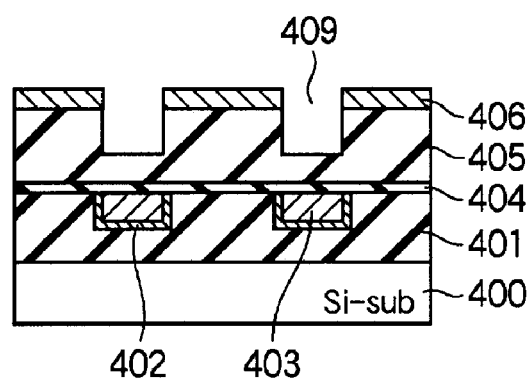

Subsequently, the SiCO film 407 and the amorphous carbon film 406 are etched by using the photoresist film 408 as a mask (step 202, FIG. 6B), and then, the fluorine-added carbon film 405 is etched by using the SiCO film 407 and the amorphous carbon film 406 as a mask, thereby forming the trenches 409 (step 203, FIG. 6C). The etching process includes the first step of etching the fluorine-added carbon film 405 using an oxygen-containing gas and the second step of etching the fluorine-added carbon film 405 using a fluorine-containing gas, as described above.

Figure 6D:
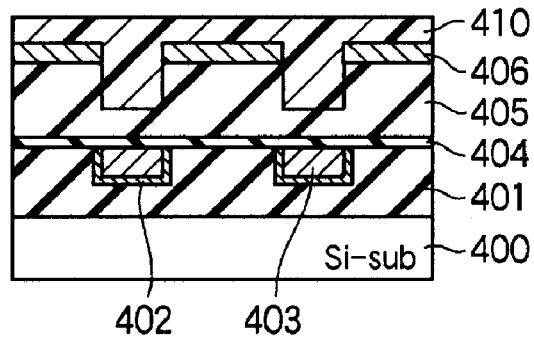

Next, a silicon-based coating film 410 as a sacrificial film is formed by spin coating to fill the trenches 409, and the silicon-based coating film 410 is planarized (step 204, FIG. 6D). The silicon-based coating film 410 is an organic silicon-containing film, for example, and is formed as spin on glass (SOG). The silicon-based coating film 410 is formed by spin coating and then is sintered by baking.

Figure 7:
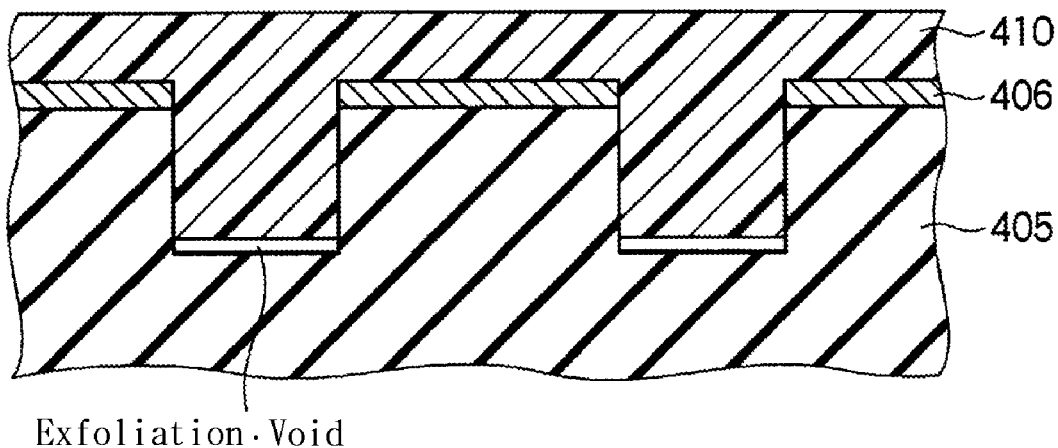
FIG. 7 illustrates the state of a silicon-based coating film to be coated as a sacrificial film after trenches are formed, and a fluorine-added carbon film.

By the way, before the silicon-based coating film 410 is formed, PGME or PGMEA as a coating material for improving a close-adhesion property of the fluorine-added carbon film 405 and the silicon-based coating film 410 is generally coated on a base of the fluorine-added carbon film 405. However, since the fluorine-added carbon film 405 has a hydrophobic property, even though PGME or PGMEA is coated on the base of the fluorine-added carbon film 405, a wetting property between the fluorine-added carbon film 405 and the silicon-based coating film 410 is not appropriate, and thus, a close-adhesion property thereof is not appropriate, and exfoliation or void occurs, as illustrated in FIG. 7. If exfoliation or void occurs, the fluorine-added carbon film 405 cannot be etched in an accurate shape.

Figure 8A:
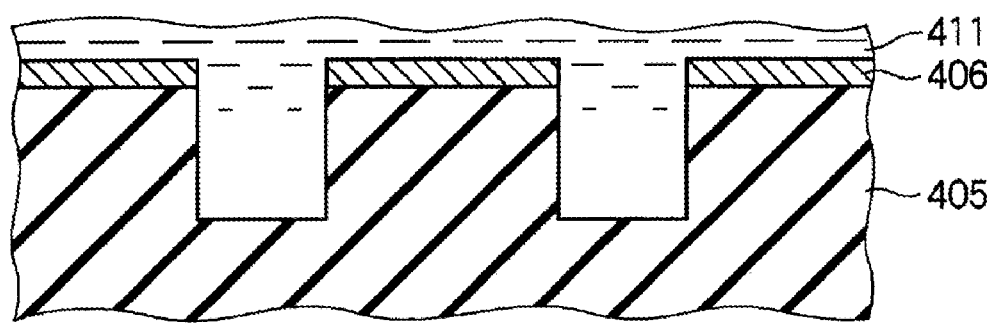
FIGS. 8A through 8C illustrate the state in which a wetting property enhancement surface reforming material is coated on the surface of the fluorine-added carbon film, and the state in which the silicon-based coating film is formed after the wetting property enhancement surface reforming material is coated on the surface of the fluorine-added carbon film.
Figure 8B:
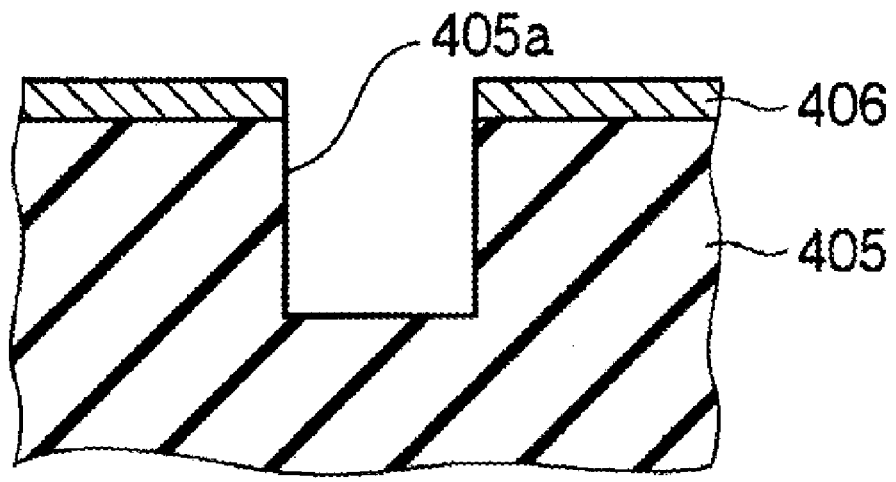
Figure 8C:
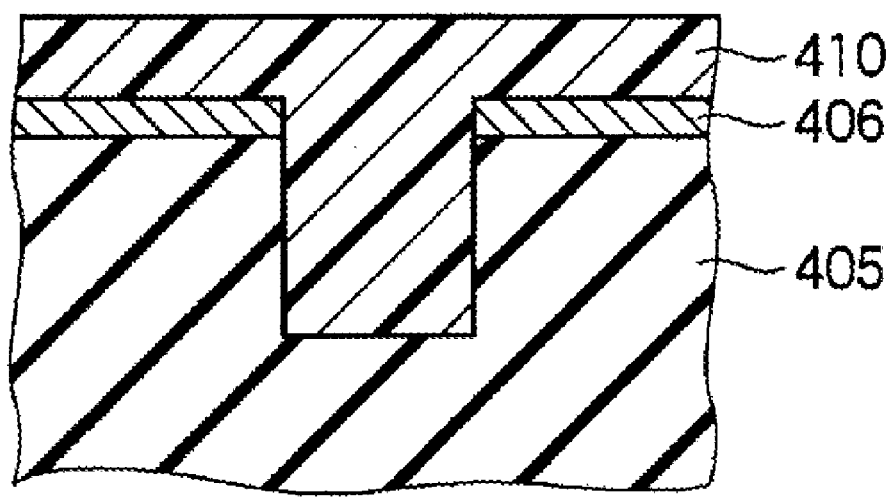

In order to prevent the problem, as illustrated in FIG. 8A, a wetting property enhancement surface reforming material 411 that reforms the surface of the fluorine-added carbon film 405 to enhance a wetting property between the fluorine-added carbon film 405 and the silicon-based coating film 410 and to obtain a better close-adhesion property thereof, may be coated on the surface of the fluorine-added carbon film 405. Thus, as illustrated in FIG. 8B, the surface of the fluorine-added carbon film 405 is a reformed surface 405a, and as illustrated in FIG. 8C, when the silicon-based coating film 410 is formed, a better close-adhesion property of the fluorine-added carbon film 405 and the silicon-based coating film 410 in which exfoliation does not occur, is obtained.

Acetone may be very appropriate to the wetting property enhancement surface reforming material 411. By using acetone, the surface of the fluorine-added carbon film 405 may be appropriately roughed, and a better close-adhesion property between the fluorine-added carbon film 405 and the silicon-based coating film 410 may be obtained. Low-grade ketone, such as 2-butanol, may be used as the wetting property enhancement surface reforming material 411. A spin coating method by which the wetting property enhancement surface reforming material 411, such as acetone, is supplied to the surface of the semiconductor wafer W through a nozzle while rotating the semiconductor wafer W, is very appropriate to a method of coating the wetting property enhancement surface reforming material 411 on the surface of the fluorine-added carbon film 405. However, the wetting property enhancement surface reforming material 411 may also be coated on the surface of the fluorine-added carbon film 405 by immersing the semiconductor wafer W in a container in which the wetting property enhancement surface reforming material 411 is contained.

Figure 9A:
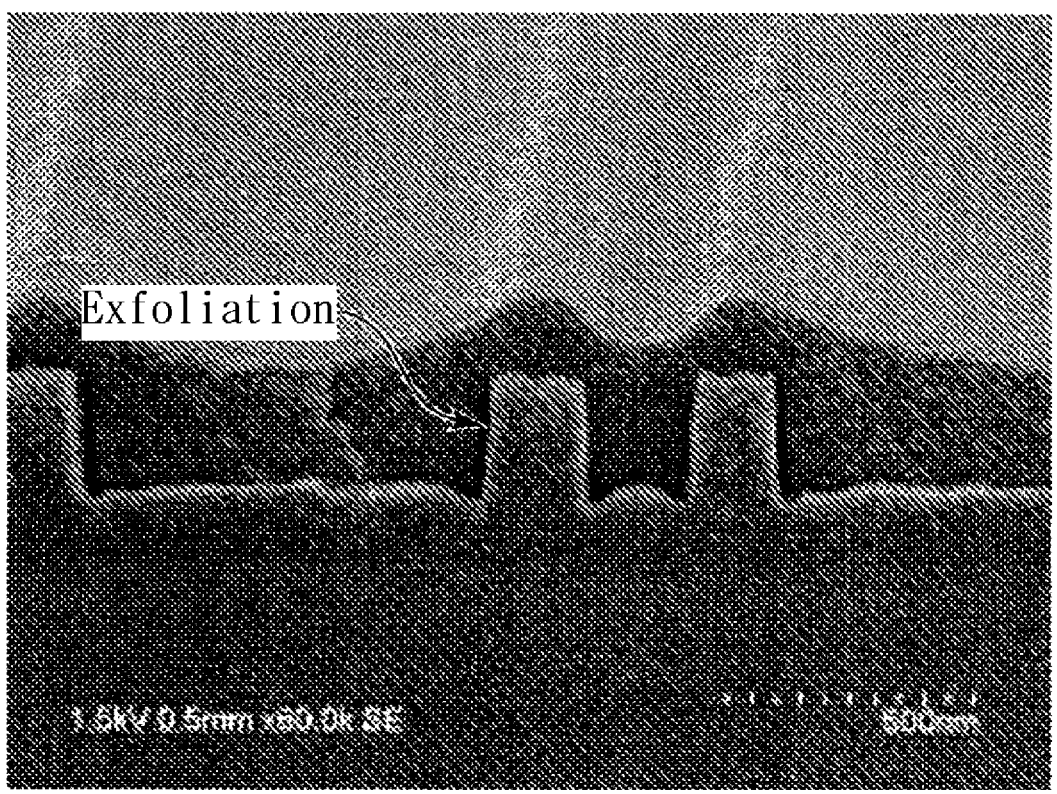
FIGS. 9A and 9B illustrate states of the fluorine-added carbon film and the silicon-based coating film when acetone as the wetting property enhancement surface reforming material is not coated, and states of the fluorine-added carbon film and the silicon-based coating film when acetone is coated, respectively.
Figure 9B:
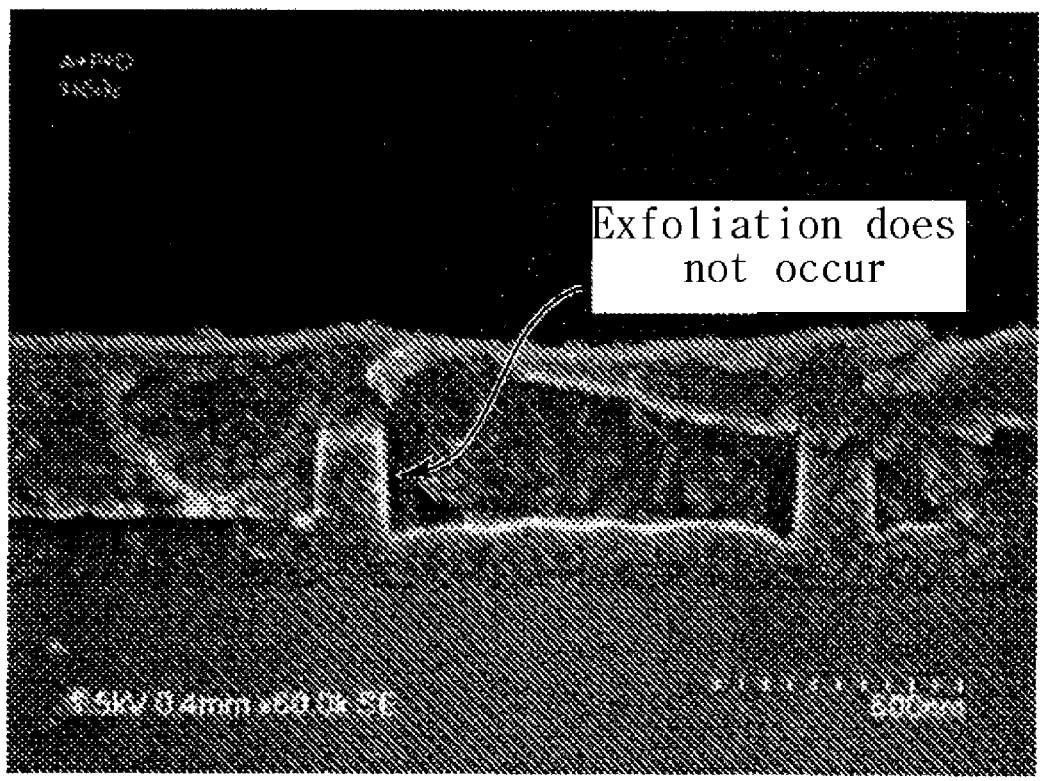

In an experiment, the effect of acetone as the wetting property enhancement surface reforming material 411 was ascertained. Thus, when acetone was not coated on the fluorine-added carbon film 405, as shown in a scanning electron microscope (SEM) image of FIG. 9A, exfoliation occurred between the fluorine-added carbon film 405 and the silicon-based coating film 410. In contrast with this, when acetone was coated on the fluorine-added carbon film 405, as shown in a SEM of FIG. 9B, exfoliation did not occur.

Figure 6E:
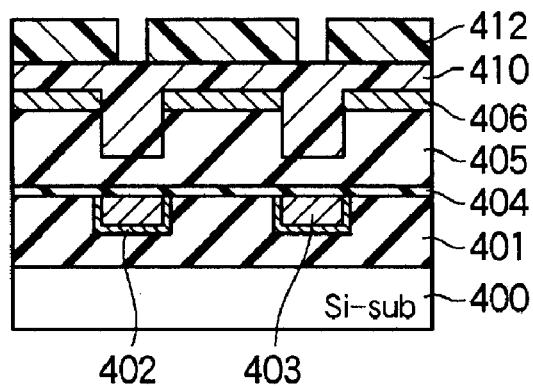
Figure 6F:
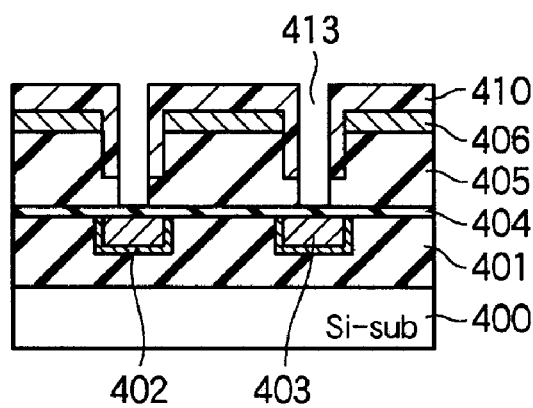

After the silicon-based coating film 410 is coated in step 204, the photoresist film 412 is formed on the silicon-based coating film 410, and patterns for forming vias 413 are formed by a photolithography process (step 205, FIG. 6E). Subsequently, the fluorine-added carbon film 405 is etched by using the photoresist film 412 as a mask, thereby forming the vias 413 (step 206, FIG. 6F). The etching process includes the first step of etching the fluorine-added carbon film 405 using the oxygen-containing gas and the second step of etching the fluorine-added carbon film 405 using the fluorine-containing gas, as described above.

Figure 6G:
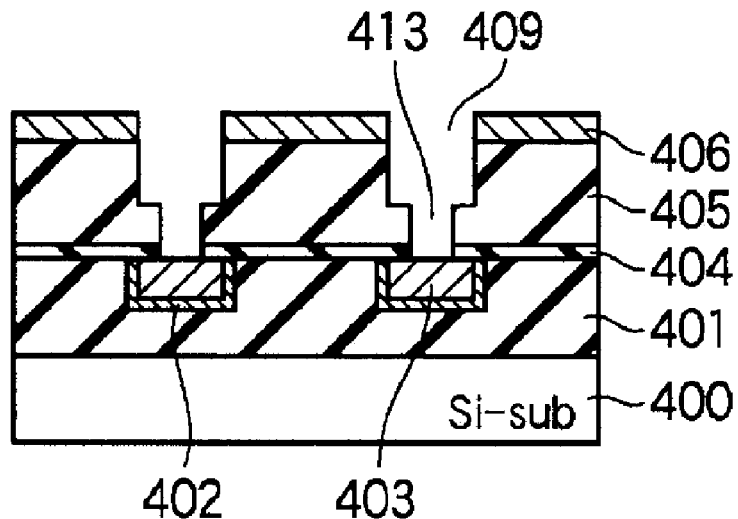

After the vias 413 are etched, the silicon-based coating film 410 is removed by wetting process using DHF (for example, 1% hydrofluoric acid (HF)) or BHF, and the stopper layer 404 is etched by dry etching using a $C_xF_y$-based gas to expose the Cu wiring layer 403 (step 207, FIG. 6G).

Here, the amount of fluorine from the fluorine-added carbon film 405 is increased by damage caused by dry etching. If the amount of fluorine from the fluorine-added carbon film 405 is increased, a close-adhesion property between the fluorine-added carbon film 405 and an upper layer to be formed on the fluorine-added carbon film 405 may be lowered in a subsequent thermal process and thus exfoliation may occur, or barrier metals, such as Ta, TaN, and Ti, which are to be formed later, may be corroded and exfoliated.

Figure 10A:
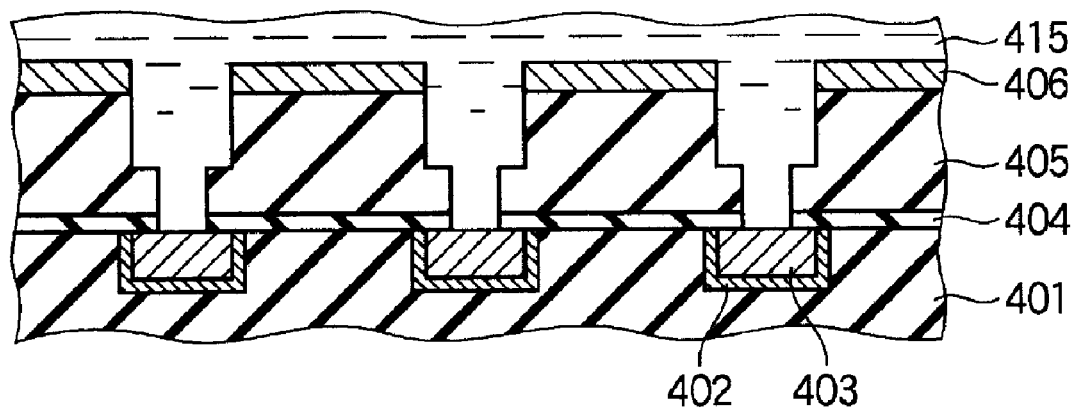
FIGS. 10A and 10B illustrate the state in which a fluorine separation inhibition surface reforming material is coated on the surface of the fluorine-added carbon film, and the state in which the surface of the fluorine-added carbon film is reformed.
Figure 10B:
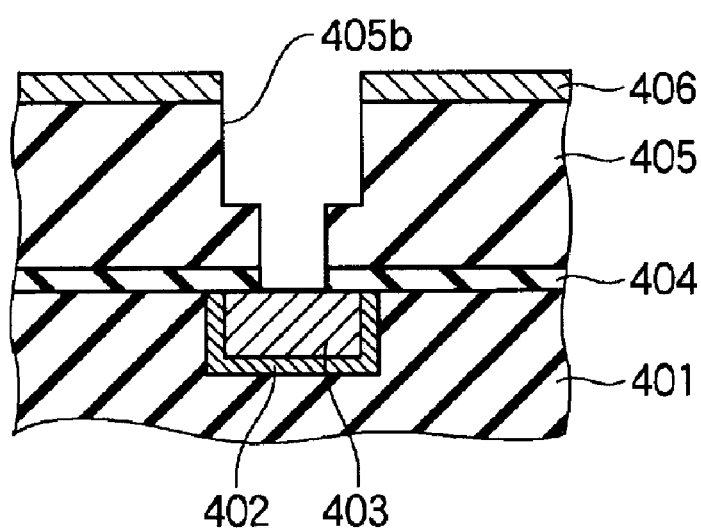

In order to prevent the problem, as illustrated in FIG. 10A, a fluorine separation inhibition surface reforming material 415 that reforms the surface of the fluorine-added carbon film 405 to inhibit the amount of fluorine from the fluorine-added carbon film 405, may be coated on the surface of the fluorine-added carbon film 405. Thus, as illustrated in FIG. 10B, the surface of the fluorine-added carbon film 405 is a reformed surface 405b, and corrosion of barrier metal to be formed later or exfoliation of an upper layer to be formed on the fluorine-added carbon film 405 can be efficiently prevented.

The fluorine separation inhibition surface reforming material 415 inhibits separation of fluorine by removing fluorine separated from the surface of the fluorine-added carbon film 405 damaged by dry etching and by treating an end of the surface of the fluorine-added carbon film 405, and since a high volatile organic solvent can be used, ethanol or methanol is very appropriate to the fluorine separation inhibition surface reforming material 415. A spin coating method by which the fluorine separation inhibition surface reforming material 415 such as ethanol is supplied to the surface of the semiconductor wafer W through a nozzle while rotating the semiconductor wafer W, is very appropriate to a method of coating the fluorine separation inhibition surface reforming material 415. However, the fluorine separation inhibition surface reforming material 415 may also be coated on the surface of the fluorine-added carbon film 405 by immersing the semiconductor wafer W in a container in which the fluorine separation inhibition surface reforming material 415 is contained.

Figure 11:
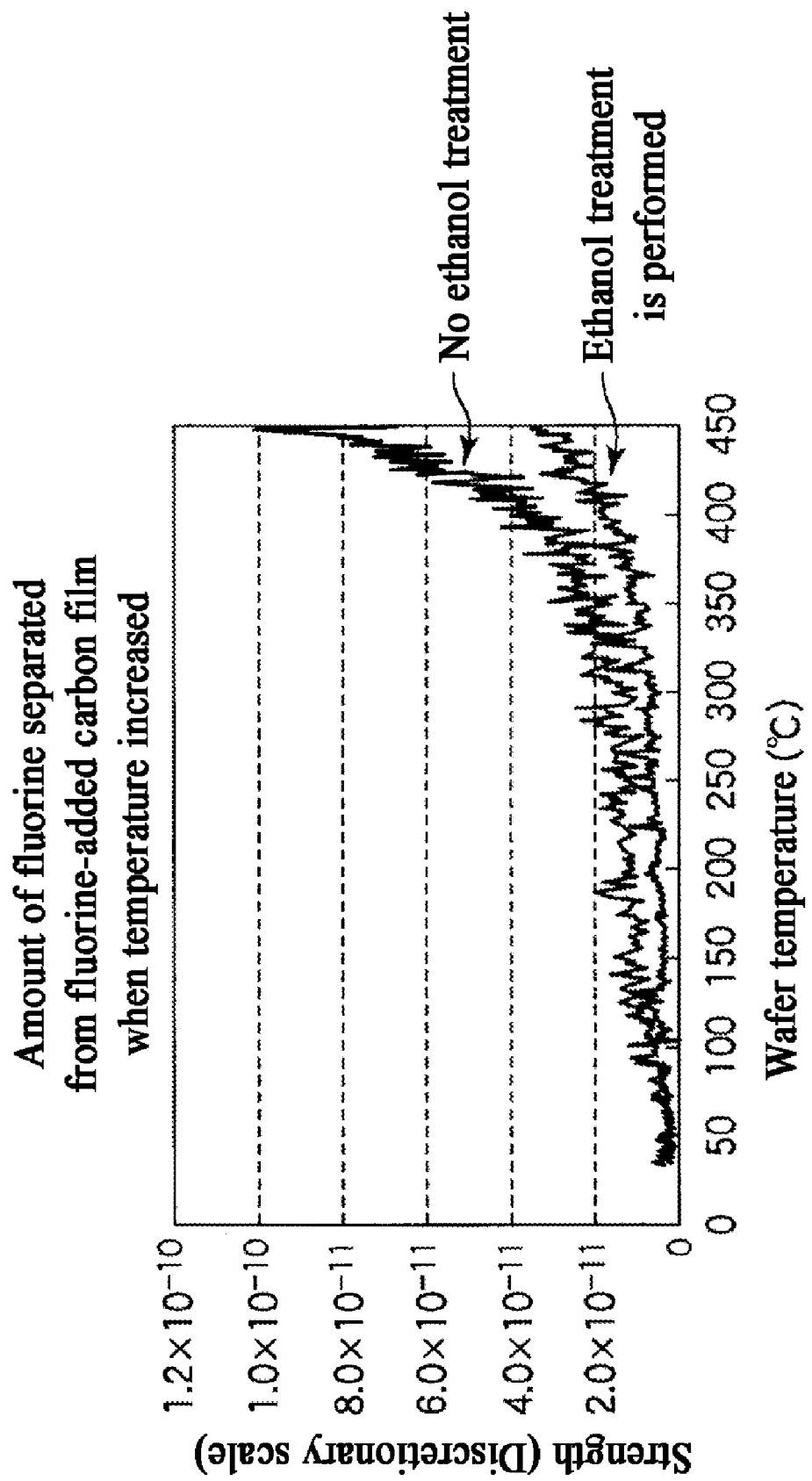
FIG. 11 illustrates a thermal desorption spectrometry (TDS) profile of fluorine that shows the effect of ethanol as a fluorine separation inhibition surface reforming material coated on the surface of the fluorine-added carbon film after trenches and vias were formed.

In an experiment, the amount of fluorine from the fluorine-added carbon film 405 was ascertained by thermal desorption spectrometry (TDS) in order to ascertain the effect of ethanol as the fluorine separation inhibition surface reforming material 415. As a result, as illustrated in FIG. 11, ethanol was coated on the surface of the fluorine-added carbon film 405 so that the amount of fluorine from the fluorine-added carbon film 405 was reduced.

Meanwhile, as illustrated in FIG. 6G, when the Cu wiring layer 403 is exposed to an oxygen-containing atmosphere while its surface is exposed, a native oxide film is formed on the surface of the Cu wiring layer 403. In addition, an impurity may be inserted in the surface of the Cu wiring layer 403. If metal is buried in the vias 413 in this state, the electric resistance of the vias 413 is increased, and thereby the resistance of wiring is increased.

Conventionally, the native oxide film has been removed by using DHF (for example, 1% HF) or BHF. However, the fluorine-added carbon film 405 is damaged, and fluorine tends to be separated from the fluorine-added carbon film 405. In addition, chemicals that causes low damage has been considered, however, the price of chemicals is high, and treatment of a waste solution of the chemicals is complicated and costs thereof increase according to ingredients of chemicals.

Figure 12:
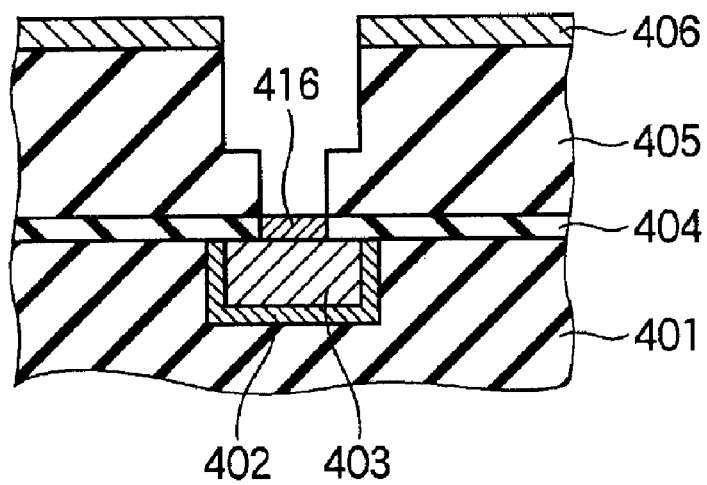
FIG. 12 illustrates the state in which a native oxide film is formed on the surface of a Cu wiring layer after the trenches and the vias were formed.
Figure 13:
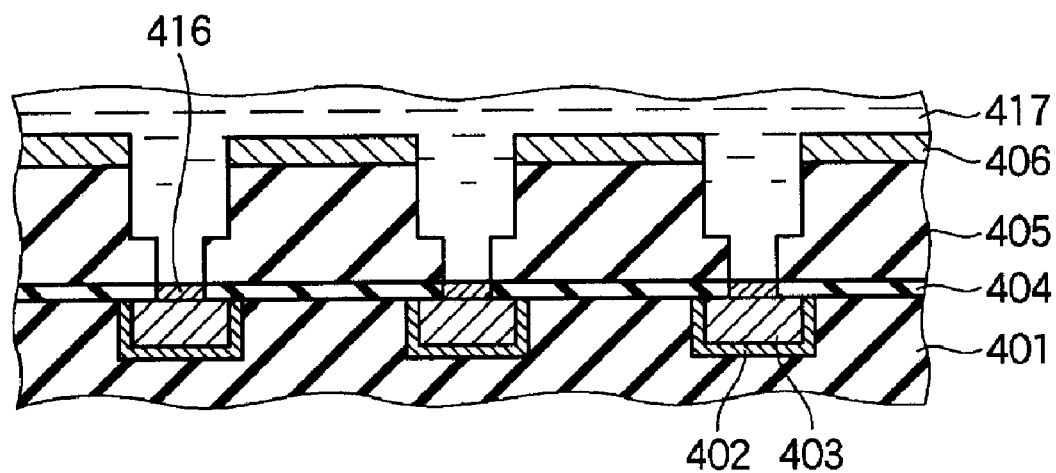
FIG. 13 illustrates the state in which ammonia water is supplied onto the surface of the Cu wiring layer when the native oxide film of FIG. 12 was formed.

It has been found that treatment of ammonia water is effective for removing the native oxide film or an impurity without causing the problem. Thus, in the step of FIG. 6G, when a native oxide film 416 is formed on the surface of the Cu wiring layer 403, as illustrated in FIG. 12, ammonia water 417 is supplied onto the surface of the Cu wiring layer 403, as illustrated in FIG. 13. By using the ammonia water 417, the native oxide film 416 formed on the surface of the Cu wiring layer 403 or the impurity formed in the surface of the Cu wiring layer 403 may be removed without damaging the fluorine-added carbon film 405. In addition, the price of the ammonia water 417 is low, and treatment of a waster solution of the ammonia water 417 is easily performed.

A reaction between the ammonia water 417 and a Cu oxide is as below.

First, the ammonia water 417 in an equilibrium state is represented by the following Formula 1:

$$NH_3 + H_2O = NH_4^+ + OH^- \tag{1}$$

The Cu oxide becomes first copper hydroxide ($Cu(OH)_2$) that is a reaction intermediate, by a reaction represented by the following Formula 2:

$$Cu + 2OH^- = Cu(OH)_2 \tag{2}$$

($Cu(OH)_2$) generates complex ions by a reaction with surplus $NH_3$, as represented by the following Formula 3:

$$Cu(OH)_2 + 4NH_3 \rightarrow [Cu(NH_3)_4]^{2+} + 2OH^- = [Cu(NH_3)_4](OH)_2 \tag{3}$$

The complex ions are dissolved in water and are in a state where CuO is dissolved.

The concentration of ammonia of the ammonia water 417 may be 0.25 wt % to 5 wt %. The reaction effectively occurs in the range so that the native oxide film 416 formed on the Cu wiring layer 403 is easily removed. In addition, the treatment time of the ammonia water 417 may be about 1 to 5 minutes, and the treatment temperature of the ammonia water 417 may be 0° C. to 30° C. A spin coating method by which the ammonia water 417 is supplied to the surface of the semiconductor wafer W through a nozzle while rotating the semiconductor wafer W, is very appropriate to a method of supplying the ammonia water 417 onto the surface of the Cu wiring layer 403. However, the ammonia water 417 may also be supplied onto the surface of the Cu wiring layer 403 by immersing the semiconductor wafer W in a container in which the ammonia water 417 is contained.

Figure 14:
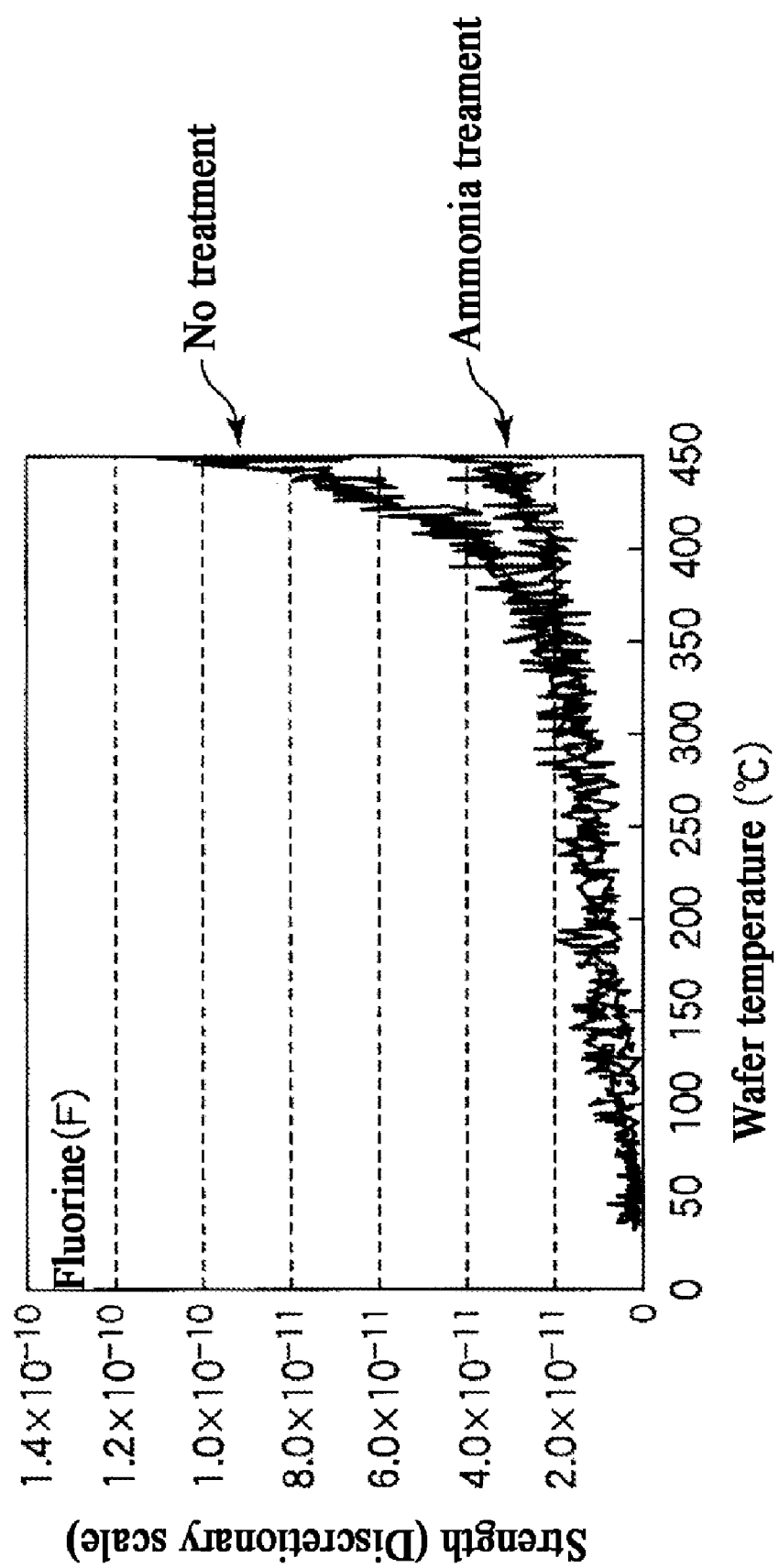
FIG. 14 illustrates a TDS profile of fluorine depending on whether ammonia processing is performed.
Figure 15A:
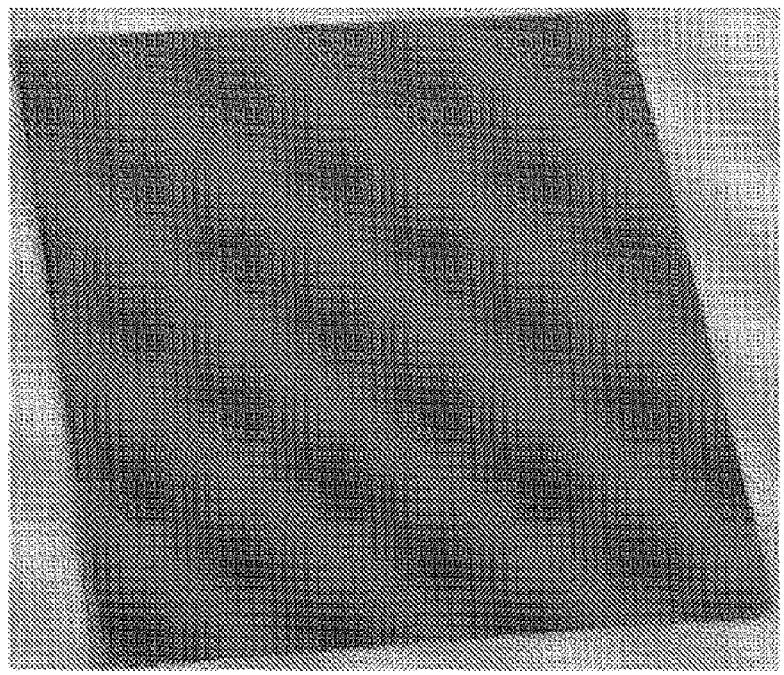
FIGS. 15A and 15B are a photo showing the state of the surface of a Cu-oxidized copper plate and a photo showing the state of the surface when ammonia treatment is performed on the Cu-oxidized copper plate, respectively.
Figure 15B:
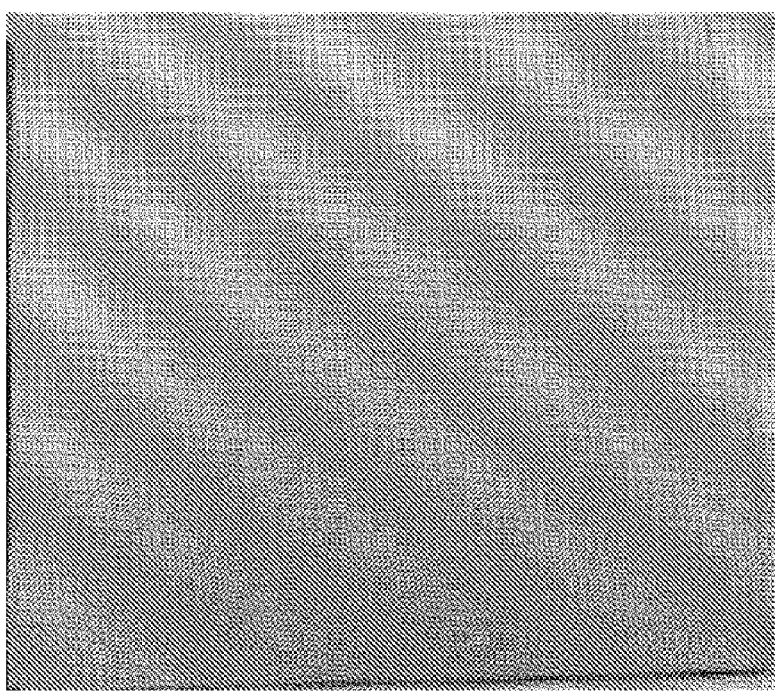

In an experiment, the effect of treatment of ammonia water was ascertained. FIG. 14 illustrates a change of TDS depending on whether treatment of the ammonia water is performed. As illustrated in FIG. 14, the amount of fluorine from the fluorine-added carbon film 405 was reduced by treatment of the ammonia water, and the fluorine-added carbon film 405 was not damaged by treatment of the ammonia water. Next, after 1% ammonia water was supplied to a copper plate of which surface is oxidized with Cu and was kept for 4 minutes, the surface of the Cu-oxidized copper plate was changed into the state shown in the photo of FIG. 15B from the state shown in the photo of FIG. 15A, and thus it was ascertained that a Cu oxide film was removed.

Figure 6H:
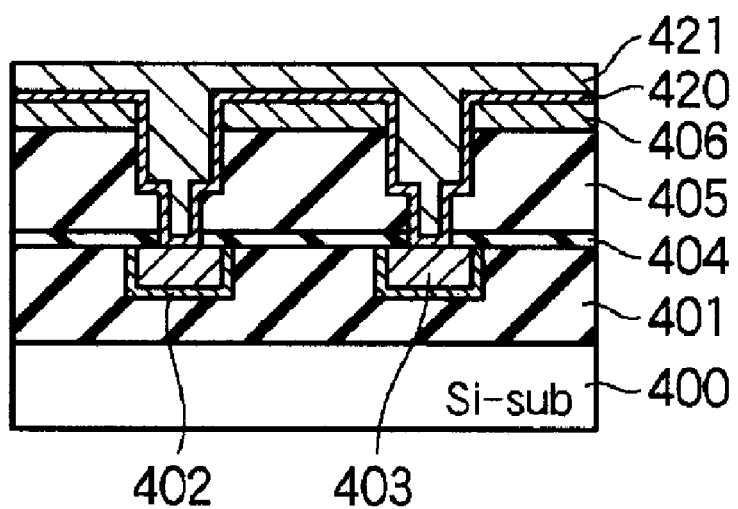

As occasions demand, after the above-described process is performed, barrier metal films 420 are formed on inner walls of the trenches 409 and the vias 413, respectively, and additionally, copper 421 as a wiring metal is buried in the trenches 409 and the vias 413 by electroplating (step 208, FIG. 6H). After that, the semiconductor wafer W is thermally processed so that annealing of the copper 421 buried in the vias 413 and the trenches 409 is performed and the copper 421 is additionally planarized by chemical mechanical polishing (CMP) (step 209).

Thus, a desired semiconductor device is manufactured.

In the above description, when a damascene process is performed, an example in which trenches are formed at an initial stage and then vias are formed has been illustrated (trench first, via last), however, vias may be formed at an initial stage and then trenches may be formed (via first, trench last).

Figure 16:
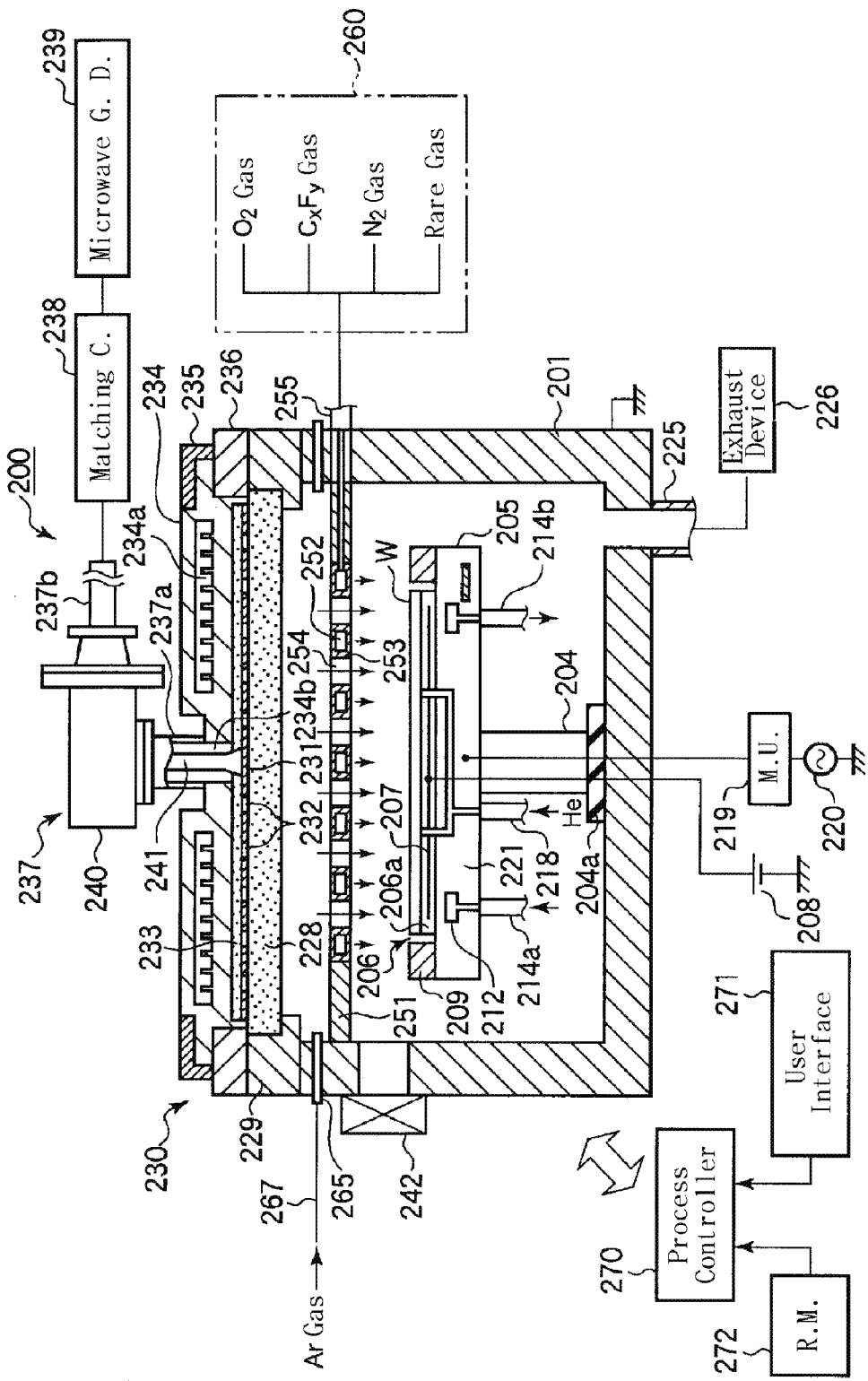
FIG. 16 illustrates a plasma processing apparatus in which the etching method according to the present invention can be performed, according to another embodiment of the present invention.

Next, another plasma processing apparatus in which the etching method according to the present invention can be performed, will be described. FIG. 16 is a cross-sectional view of another plasma processing apparatus 200 to which the etching method according to the present invention can be applied. Referring to FIG. 16, the plasma processing apparatus 200 is a radial line slot antenna (RLSA) microwave plasma processing apparatus that generates plasma by introducing microwaves into a processing chamber via a RLSA that is a planar antenna having a plurality of slots formed therein.

The plasma processing apparatus 200 includes a processing chamber (processing container) 201 that has approximately a cylindrical shape, is airtightly structured and is grounded, and a semiconductor wafer W that is an object to be processed is etched in the processing chamber 201. A microwave introduction unit 230 that introduces microwaves into a processing space of the processing chamber 201, is disposed above the processing chamber 201.

A susceptor 205 that holds the semiconductor wafer W that is an object to be processed, in a horizontal direction, is installed in the processing chamber 201 and is supported by a support member 204 that is installed in the center of a bottom of the processing chamber 201 via an insulation member 204a and has a tube shape.

An electrostatic chuck 206 is disposed on a top surface of the susceptor 205. The electrostatic chuck 206 has a structure in which an electrode 207 formed of a conductive layer is formed inside an insulator 206a, and a DC voltage is applied to the electrode 207 from a DC power supply source 208 so that the semiconductor wafer W is electrostatically absorbed on the electrostatic chuck 206.

A ring-shaped focus ring 209 is disposed around the electrostatic chuck 206 (the semiconductor wafer W) so as to enhance uniformity of etching.

A refrigerant chamber 212 in which a cooling medium of a predetermined temperature is circulated, is formed in the susceptor 205, and thus, the temperature of the susceptor 205 is controlled to a desired temperature. An introduction pipe 214a and a discharge pipe 214b are connected to the refrigerant chamber 212. A refrigerant is circulated so that the temperature of processing the semiconductor wafer W that is held on the susceptor 205 can be controlled. In addition, a heat transfer gas, such as a He gas, is supplied to a back side of the semiconductor wafer W via a gas path 218, and the temperature of the semiconductor wafer W is controlled to a predetermined temperature due to the heat transfer gas.

In addition, a high-frequency bias power supply source 220 is electrically connected to the susceptor 205 via a matching unit 219. High-frequency power is supplied to the susceptor 205 from the high-frequency bias power supply source 220 so that ions are dragged into the semiconductor wafer W. The high-frequency bias power supply source 220 outputs high-frequency power in the range of 300 kHz to 13.56 MHz, for example.

An exhaust pipe 225 is connected to the bottom of the processing chamber 201, and an exhaust device 226 including a vacuum pump is connected to the exhaust pipe 225. The exhaust device 226 includes the vacuum pump such as a turbo molecular pump, and a pressure control valve, and sets the inside of the processing chamber 201 to a predetermined depressurization atmosphere. A gate valve 242 is disposed in side wall portions of the processing chamber 201.

An upper portion of the processing chamber 201 is an opening, and the microwave introduction unit 230 is airtightly disposed to close the opening. The microwave introduction unit 230 includes a transmission plate 228, a planar antenna member 231, and a wavelength-shortening member 233 in the order from the side of the susceptor 205. The transmission plate 228, the planar antenna member 231, and the wavelength-shortening member 233 are covered by a shield member 234, a push ring 236, and an upper plate 229.

The transmission plate 228 is formed of a dielectric material and functions as a microwave introduction window through which microwaves are transmitted and which introduces the microwaves into a processing space of the processing chamber 201. The transmission plate 228 is supported in an air tight state by the upper plate 229, which is disposed in a ring shape below an outer circumferential part of the microwave introduction unit 230.

The planar antenna member 231 forms a circular plate shape and is hung in an inner circumferential surface of the shield member 234 above the transmission plate 228. The planar antenna member 231 is formed of a conductor, and a plurality of slot holes 232 through which electromagnetic waves such as microwaves are radiated, perforate the planar antenna member 231 in predetermined patterns so that the planar antenna member 231 constitutes an RLSA.

Figure 17:
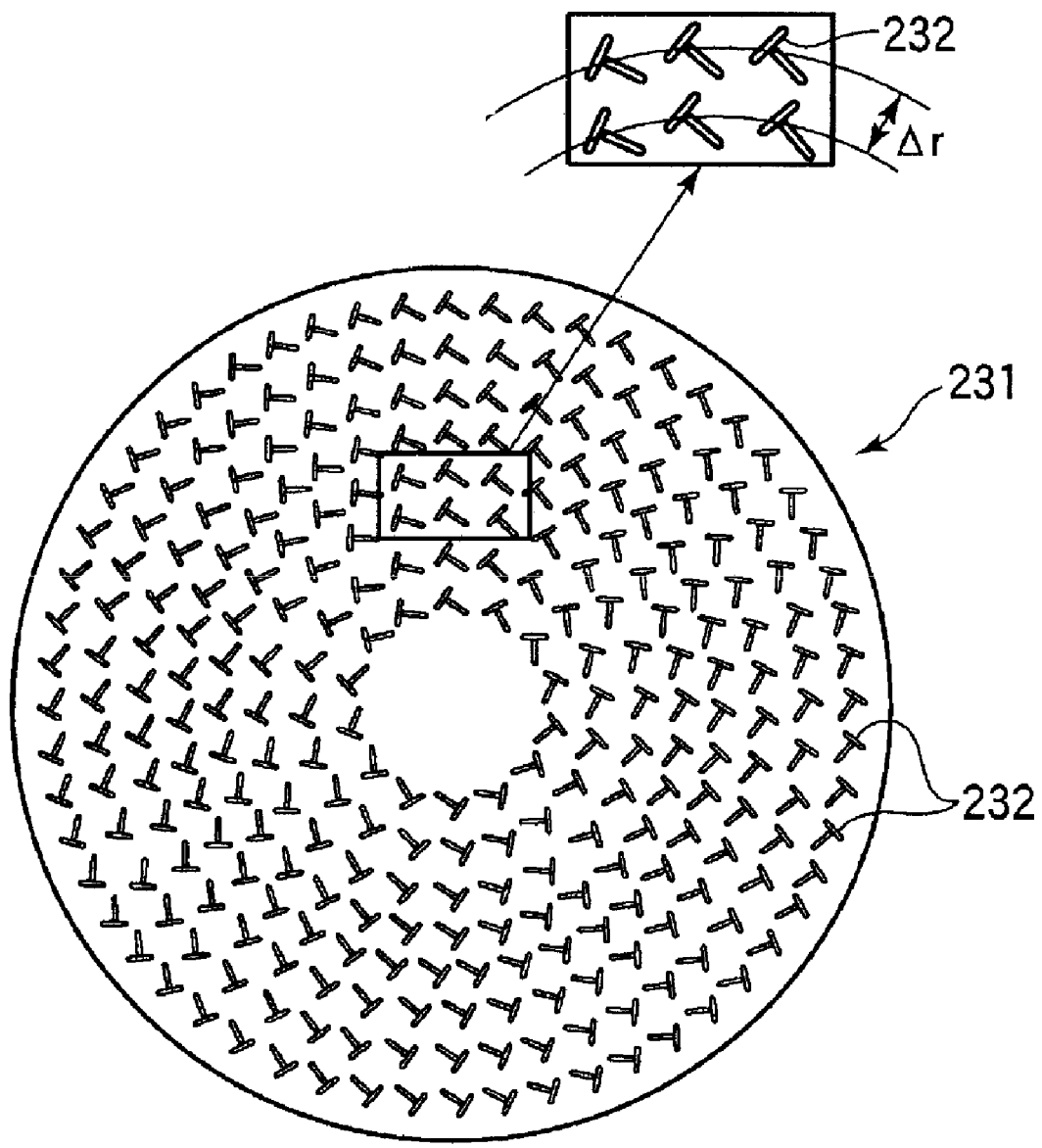
FIG. 17 illustrates a structure of a planar antenna member used in the plasma processing apparatus of FIG. 16.

The slot holes 232 form a long groove shape, as illustrated in FIG. 17, and the adjacent slot holes 232 are generally disposed to have a T-shape, and the plurality of slot holes 232 are disposed in a concentric circle shape. The length of the slot holes 232 or a distance of the arrangement of the slot holes 232 is determined by a wavelength $\lambda_g$ of the microwaves absorbed in the wavelength-shortening member 233, and for example, the distance of the arrangement of the slot holes 232 is set to ½ $\lambda g$ or $\lambda g$. In addition, the slot holes 232 may have another shape such as a circular shape or a circular arc shape, and their arrangement shape is not limited to this.

The wavelength-shortening member 233 has higher permittivity than vacuum and is formed on the planar antenna member 231. The wavelength-shortening member 233 is formed of a dielectric material, and the wavelength of the microwaves is lengthened in a vacuum state, and thus, the wavelength-shortening member 233 controls plasma by shortening the wavelength of the microwaves.

A cooling water flow path 234a is formed in the shield member 234, and cooling water is flown through the cooling water flow path 234a so that the shield member 234, the wavelength-shortening member 233, the planar antenna member 231, and the transmission plate 228 are cooled. In addition, the shield member 234 is grounded.

An opening 234b is formed in the center of the shield member 234, and a waveguide 237 is connected to the opening 234b. A microwave generating device 239 is connected to an end of the waveguide 237 via a matching circuit 238. Thus, microwaves having the frequency of 2.45 GHz, for example, generated by the microwave generating device 239 are propagated to the planar antenna member 231 via the waveguide 237. The frequency of the microwaves may be 8.35 GHz, 1.98 GHz and the like.

The waveguide 237 includes a coaxial waveguide 237a that extends from the opening 234b of the shield member 234 upward and has a circular cross-section, and a rectangular waveguide 237b that is connected to a top end of the coaxial waveguide 237a via a mode converter 240 and extends in a horizontal direction. The mode converter 240 interposed between the rectangular waveguide 237b and the coaxial waveguide 237a, converts a TE (Traverse Electric) mode of the microwaves in the rectangular waveguide 237b into a TEM (Traverse ElectroMagnetic) mode. An inner conductor 241 is disposed in the center of the coaxial waveguide 237a, and a bottom end of the inner conductor 241 is connected and fixed to a center of the planar antenna member 231. Thus, the microwaves are propagated into the planar antenna member 231 via the inner conductor 241 of the coaxial waveguide 237a so as to radiate with good efficiency and uniformity.

Figure 18:
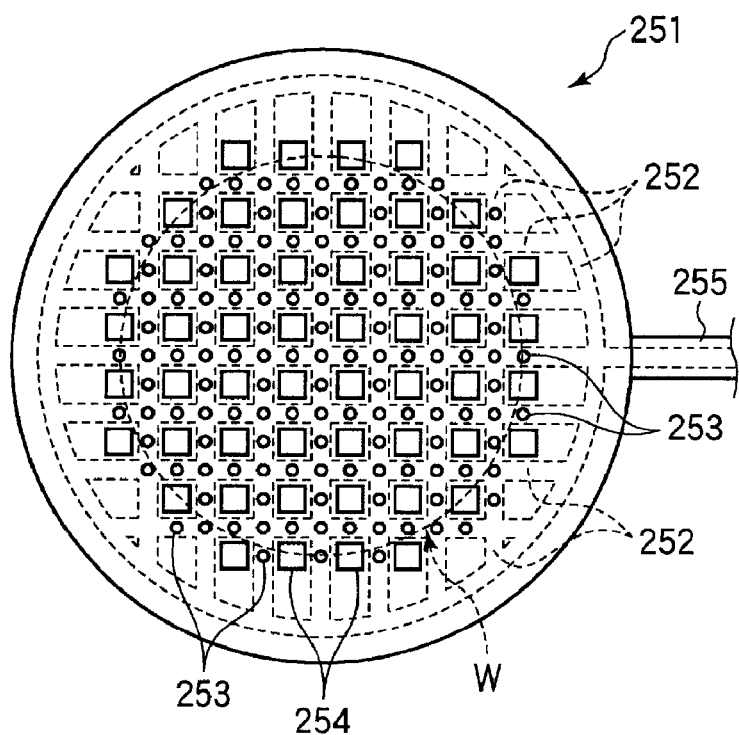
FIG. 18 is a plan view of a structure of a shower plate used in the plasma processing apparatus of FIG. 16.

A shower plate 251 is disposed between the susceptor 205 in the processing chamber 201 and the microwave introduction unit 230 in a horizontal direction so as to introduce a processing gas. Referring to FIG. 18, the shower plate 251 includes gas flow paths 252 formed in a lattice shape and a plurality of gas discharge holes 253 formed in the gas flow path 252, and space portions 254 are formed between the lattice-shaped gas flow paths 252. A gas supply pipe 255 is connected to the gas flow paths 252 of the shower plate 251 and extends to an outside of the processing chamber 201. The gas supply pipe 255 is connected to a processing gas supply unit 260 that supplies the processing gas for plasma processing. A processing gas supply source supplying an $O_2$ gas, a $C_xF_y$ gas such as a $CF_4$ gas, a $N_2$ gas, or a rare gas such as an Ar gas, which is the processing gas, is provided in the processing gas supply unit 260, and the processing gas can be supplied to the inside of the processing chamber 201 at a predetermined flow rate.

Meanwhile, a ring-shaped plasma gas introduction member 265 is arranged in an upper direction of the shower plate 251 of the processing chamber 201 along walls of the processing chamber 201, and a plurality of gas discharge holes are formed in an inner circumferential part of the plasma gas introduction member 265. A pipe 267 that supplies an Ar gas as the processing gas, is connected to the plasma gas introduction member 265. The Ar gas introduced into the processing chamber 201 via the pipe 267 and the plasma gas introduction member 265, is plasmatized by the microwaves introduced into the processing chamber 201 via the microwave introduction unit 230, and the Ar plasma passes through the space portion 254 of the shower plate 251, and the processing gas discharged from the gas discharge holes 253 of the shower plate 251 is plasmatized.

The plasma processing apparatus 200 includes a process controller 270 that is a microprocessor (computer) that controls elements of the plasma processing apparatus 200, and the elements of the plasma processing apparatus 200 are controlled while being connected to the process controller 270. A user interface 271 and a recording unit 272 are connected to the process controller 270. The process controller 270, the user interface 271, and the recording unit 272 have the same configuration as that of the process controller 70, the user interface 71, and the recording unit 72, which are shown in FIG. 1.

In the plasma processing apparatus 200, the semiconductor wafer W is carried into the processing chamber 201 and is held on the susceptor 205, and then, the Ar gas is introduced into the processing chamber 201 via the pipe 267 and the plasma gas introduction member 265, and the microwaves generated by the microwave generating device 239 are introduced to the waveguide 237 via the matching circuit 238, and the microwaves sequentially pass through the rectangular waveguide 237b, the mode converter 240, and the coaxial waveguide 237a so as to be supplied to the planar antenna member 231 via the inner conductor 241, and the microwaves are radiated onto the processing chamber 201 from the slots formed in the planar antenna member 231 via the transmission plate 228. The microwaves are propagated in the TE mode in the rectangular waveguide 237b, and the microwaves in the TE mode are converted by the mode converter 240 into the TEM mode, and the converted microwaves are propagated toward the planar antenna member 231 via the coaxial waveguide 237a and are radiated onto the processing chamber 201 via the transmission plate 228 from the planar antenna member 231, and the Ar gas for generating plasma is plasmatized by the microwaves.

Subsequently, a predetermined process gas is supplied by the processing gas supply unit 260 at a predetermined flow rate so that the processing gas is excited and plasmatized by the Ar plasma that has passed through the space portion 254 of the shower plate 251 and a predetermined plasma process is performed by the processing gas plasma and Ar plasma.

The plasma has a high density of about $1 \times 10^{11}$ to $5 \times 10^{12}/$ cm$^3$ when the microwaves are radiated from the slots 232 formed in the planar antenna member 231, and low electron temperature of about 1.5 eV or less near the semiconductor wafer W. Thus, etching can be performed with low damage.

The plasma process performed by the plasma processing apparatus 200 may correspond to any of steps 3 through 8 and thus can be performed under conditions of the plasma processing apparatus 10 of FIG. 1. In particular, the plasma process performed by the plasma processing apparatus 200 is very appropriate to the second step of etching the CF$_x$ film 302 using gas containing gas indicated by $C_xF_y$ (where x and y are natural numbers) in step 8. In the second step of etching the CF$_x$ film 302, a very thin portion of a surface of the CF$_x$ film 302 is removed after the first step of etching the CF$_x$ film 302. Thus, the CF$_x$ film 302 needs to be etched with low damage. However, the RLSA microwave plasma having a high plasma density and low electron temperature can be used to perform a plasma process with low damage, and thus, the RLSA microwave plasma is very appropriate to the etching.

Next, an experiment in which the etching method according to the present invention is actually used, will be described. First, a descum process for removing a development residue was performed by using the plasma processing apparatus 10 of FIG. 1 on a semiconductor wafer W having the structure of FIG. 3A in which a SiCN film as an etching stopper layer was formed to a thickness of 10 nm on a silicon substrate by using a silicon wafer having a thickness of 200 mm, a CF$_x$ film was formed on the SiCN film to a thickness of 270 nm, for example, a SiCN film as a hard mask layer was formed on the CF$_x$ film to a thickness of 30 nm, a resist film made of a KrF resist was formed on the SiCN film to a thickness of 400 nm, and patterns having a width of about 200 nm were formed in the resist film was formed by a photolithography process. The descum process was performed under conditions of an Ar gas and an O$_2$ gas flown at flow rates of 135 mL/min(sccm) and 65 mL/min(sccm), respectively, pressure inside a processing chamber of 1.33 Pa (10 mTorr), high-frequency power of 500 W applied to an upper electrode, high-frequency power of 200 W applied to a lower electrode, and a gap between the upper electrode and the lower electrode of 55 mm, for 10 seconds. Subsequently, the SiCN film as a hard mask layer was etched halfway by using the resist film as an etching mask. The etching was performed under conditions of a N$_2$ gas and a CF$_4$ gas flown at flow rates of 30 mL/min(sccm) and 90 mL/min(sccm), respectively, pressure inside the processing chamber of 6 Pa (45 mTorr), high-frequency power of 500 W applied to the upper electrode, high-frequency power of 100 W applied to the lower electrode, and a gap between the upper electrode and the lower electrode of 60 mm, for 18 seconds, and thereby the hard mask layer was etched to about ¼ of its original thickness. After that, the resist film was removed by ashing. The ashing was performed under conditions of an O$_2$ gas flown at a flow rate of 300 mL/min(sccm), pressure inside the processing chamber of 1.3 Pa (10 mTorr), high-frequency power of 300 W applied to the upper electrode, high-frequency power of 250 W applied to the lower electrode, and a gap between the upper electrode and the lower electrode of 55 mm, for 18 seconds. After that, the residual portion of the hard mask layer was etched on the same conditions described above for 10 seconds, so as to expose the CF$_x$ film.

Next, a first step of etching the CF$_x$ film was performed by using the hard mask layer as an etching mask under conditions of an O$_2$ gas flown at a flow rate of 65 mL/min(sccm) and an Ar gas flown at a flow rate of 135 mL/min(sccm), pressure inside the processing chamber of 1.3 Pa (10 mTorr), high-frequency power of 500 W applied to the upper electrode, high-frequency power of 150 W applied to the lower electrode, and a gap between the upper electrode and the lower electrode of 55 mm, for 12 seconds. Subsequently, a second step of etching the CF$_x$ film was performed under conditions of a CF$_4$ gas as a processing gas flown at a flow rate of 100 mL/min(sccm), pressure inside the processing chamber of 1.3 Pa (10 mTorr), high-frequency power of 500 W applied to the upper electrode, and a gap between the upper electrode and the lower electrode of 60 mm without applying a bias voltage to the lower electrode, for 7 seconds.

Figure 19:
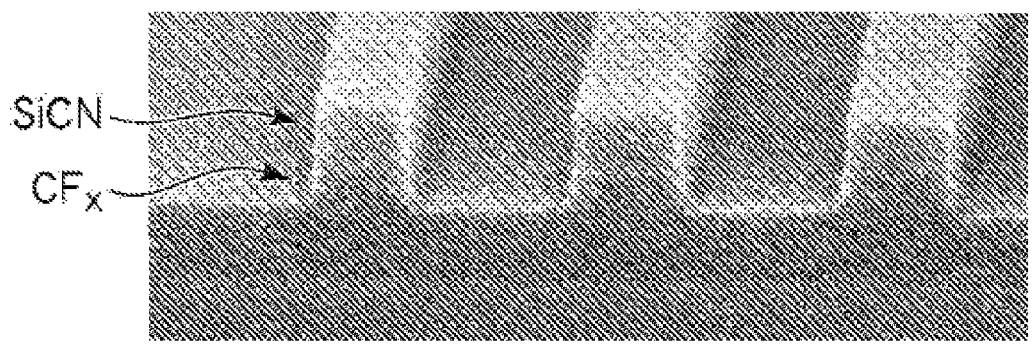
FIG. 19 is a scanning electron microscope (SEM) image showing a cross-section of a wafer sample after a first step of etching a $CF_x$ film of the etching method according to the present invention was terminated.
Figure 20:
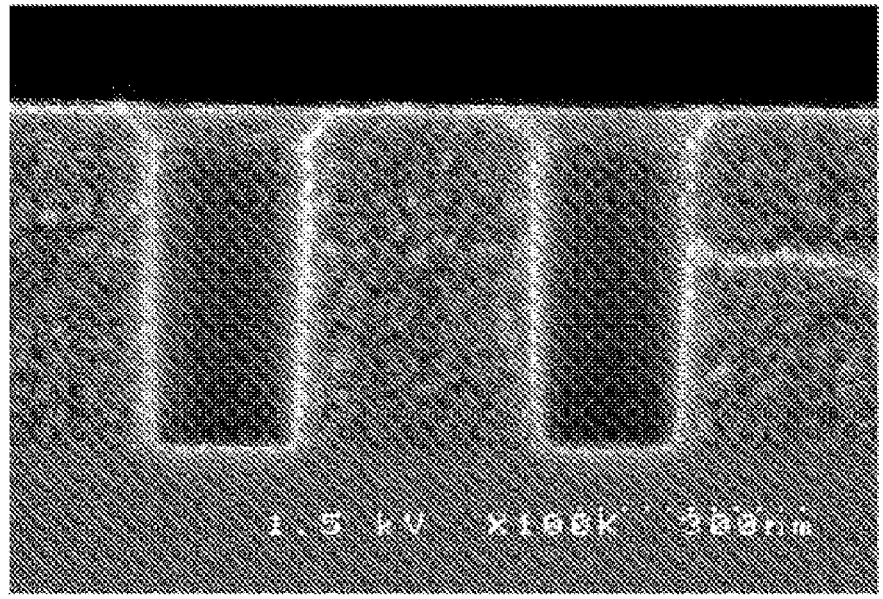
FIG. 20 is a SEM image showing a cross-section of a wafer sample after a second step of etching the $CF_x$ film of the etching method according to the present invention was terminated.
Figure 21:
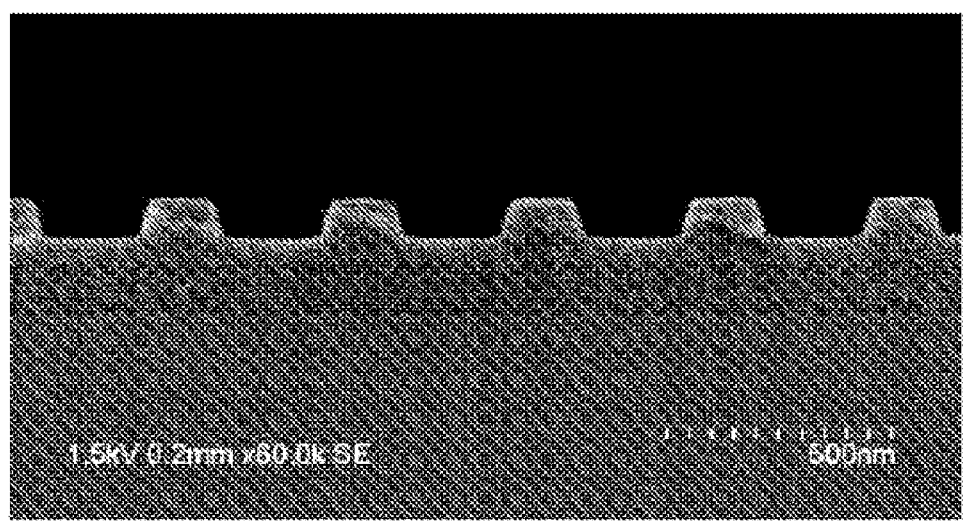
FIG. 21 is a SEM image of a cross-section of a wafer sample in which the $CF_x$ film was etched by using a $CF_4$ gas.

SEM images of a cross-section of a wafer sample, which correspond to the case when the first step of etching the CF$_x$ film was performed under the above conditions and the case when a second step of etching the CF$_x$ film was performed under the above conditions, respectively, are shown in FIGS. 19 and 20. FIG. 19 shows a SEM image of the CF$_x$ film of which lines are etched, and FIG. 20 shows a SEM image of the $CF_x$ film of which holes are etched. As shown in FIG. 19, the $CF_x$ film was etched by using an $O_2$ gas and an Ar gas so that etching with a better shape forming property, which was performed approximately in a perpendicular shape, was obtained. However, oxygen remained on the surface of the $CF_x$ film, and a surface shape was not good. In contrast with FIG. 19, as shown in FIG. 20, the $CF_x$ film was etched by using an $O_2$ gas and an Ar gas and then was etched by using a $CF_4$ gas (the first step and the second step of etching the $CF_x$ film) so that etching with a better shape forming property and a better surface shape was performed.

In addition, for comparison, when the $CF_x$ film was etched only using the $CF_4$ gas, the $CF_x$ film was etched in trapezoidal shape, and shape forming property was not good.

Figure 22:
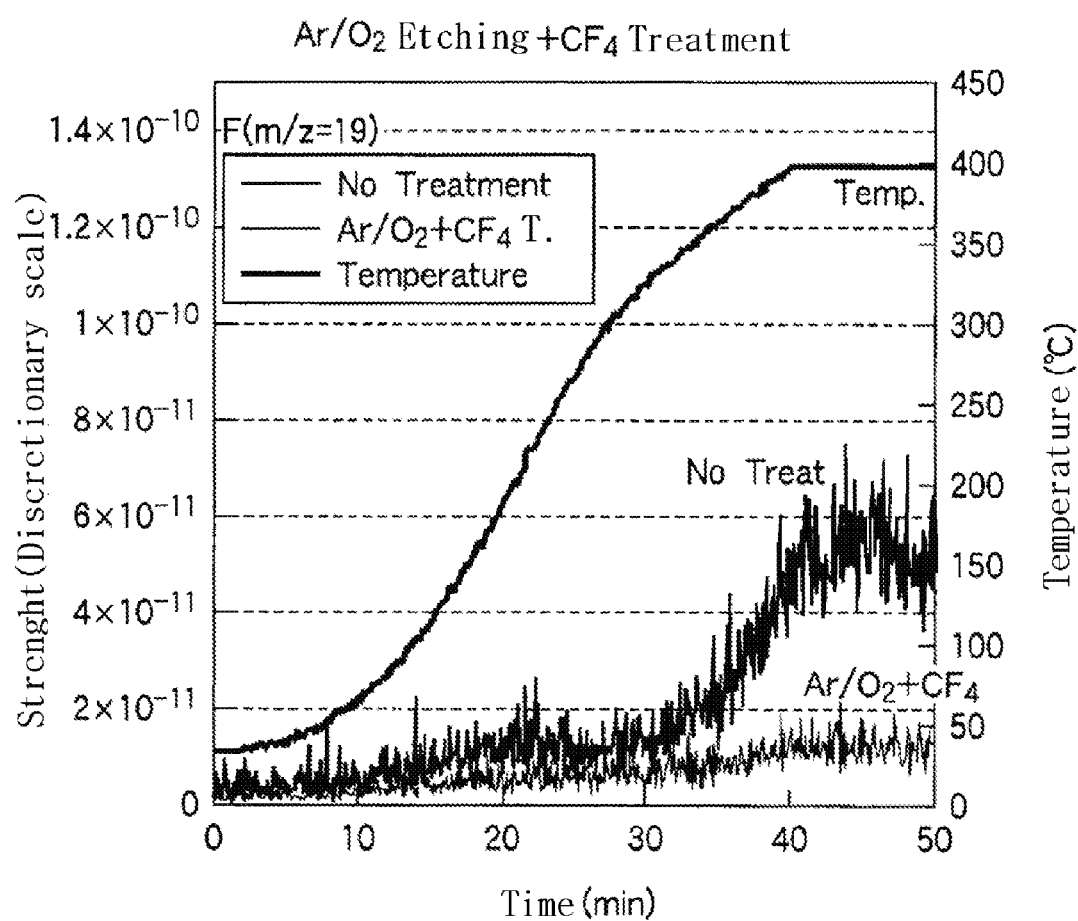
FIG. 22 illustrates a TDS profile that shows discharge of a F gas when the wafer sample on which the first and the second steps of etching were performed, was heated to 400° C., and discharge of a F gas when a sample in which the $CF_x$ film was formed on a wafer was heated to 400° C.
Figure 23:
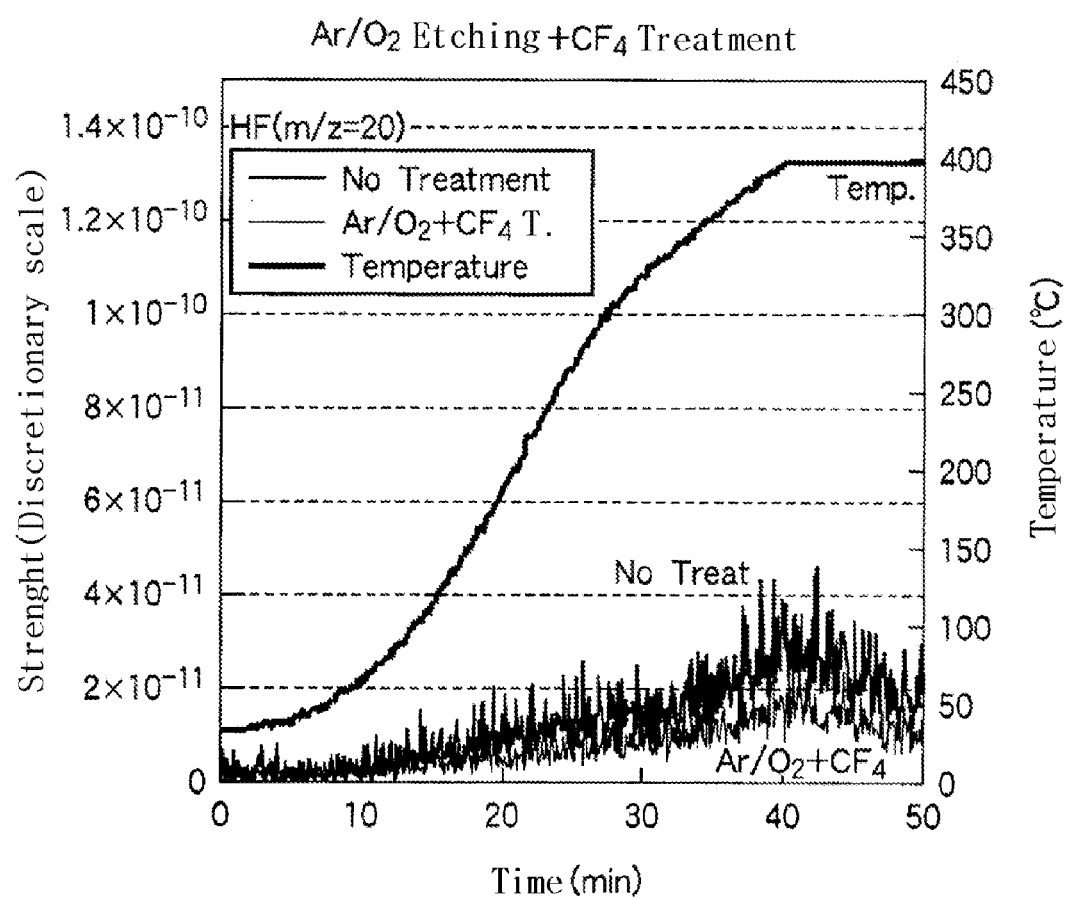
FIG. 23 illustrates a TDS profile that shows discharge of a HF gas when the wafer sample on which the first and the second steps of etching were performed, was heated to 400° C., and discharge of a HF gas when a sample in which the $CF_x$ film was formed on a wafer was heated to 400° C.

In addition, a sample in which the first step and the second step of etching the $CF_x$ film were performed, and a sample in which the $CF_x$ film was formed on a wafer, were heated to 400° C., and amount of outgas (F gas and HF gas) was ascertained by TDS, and the result thereof is shown in FIGS. 22 and 23. In addition, in FIGS. 22 and 23, data of the sample in which the $CF_x$ film was formed on the wafer, was indicated by "No Treat". In FIGS. 22 and 23, in the sample in which the first step and the second step of etching the $CF_x$ film were performed, the amount of gas separated from the $CF_x$ film was reduced than TDS data of each $CF_x$ film, and thus the efficiency of the first step and the second step of etching the $CF_x$ film in the present invention was ascertained.

Figure 24:
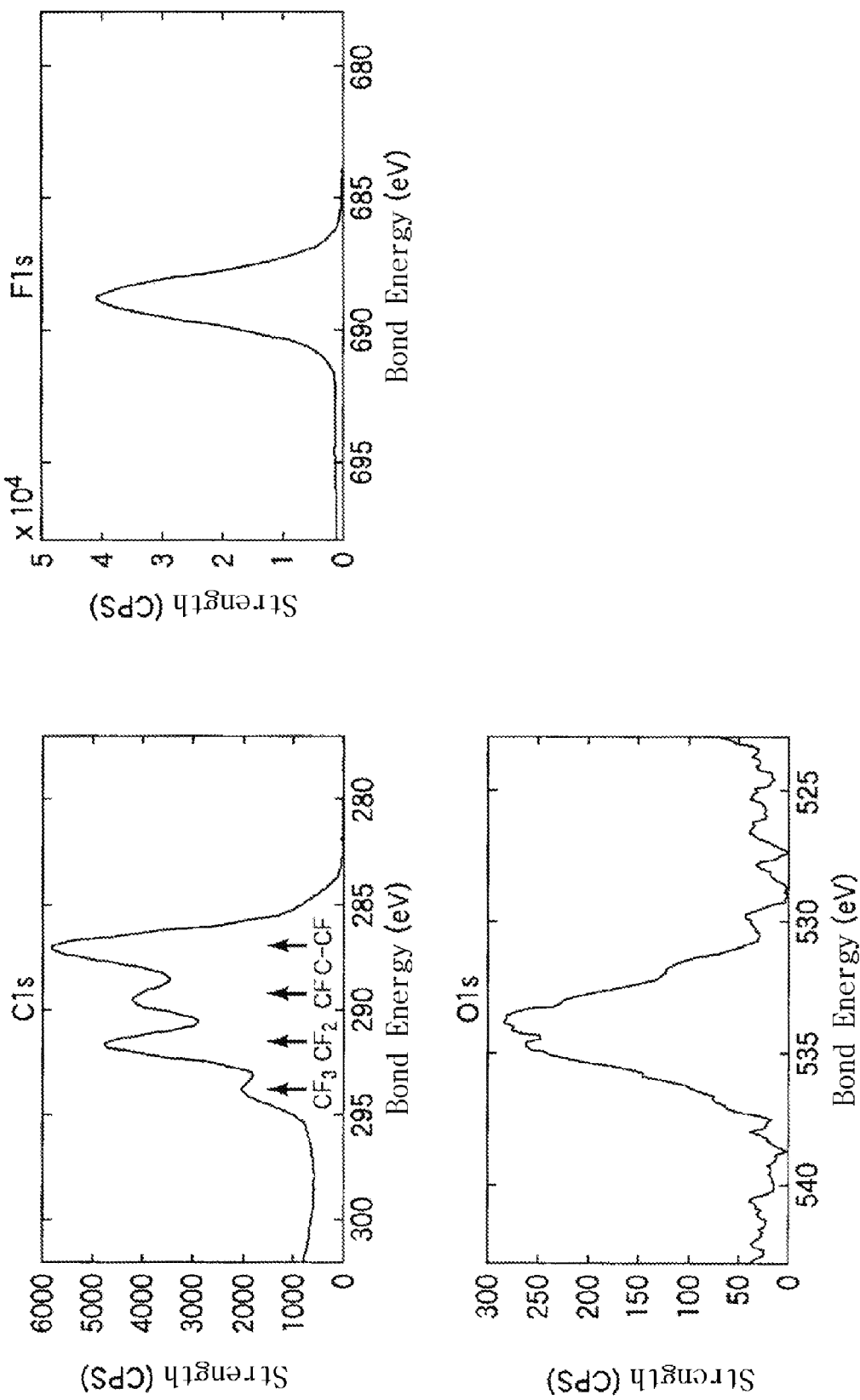
FIG. 24 illustrates X-ray photoelectron spectroscopy (XPS) profile of the $CF_x$ film before etching was performed.
Figure 25:
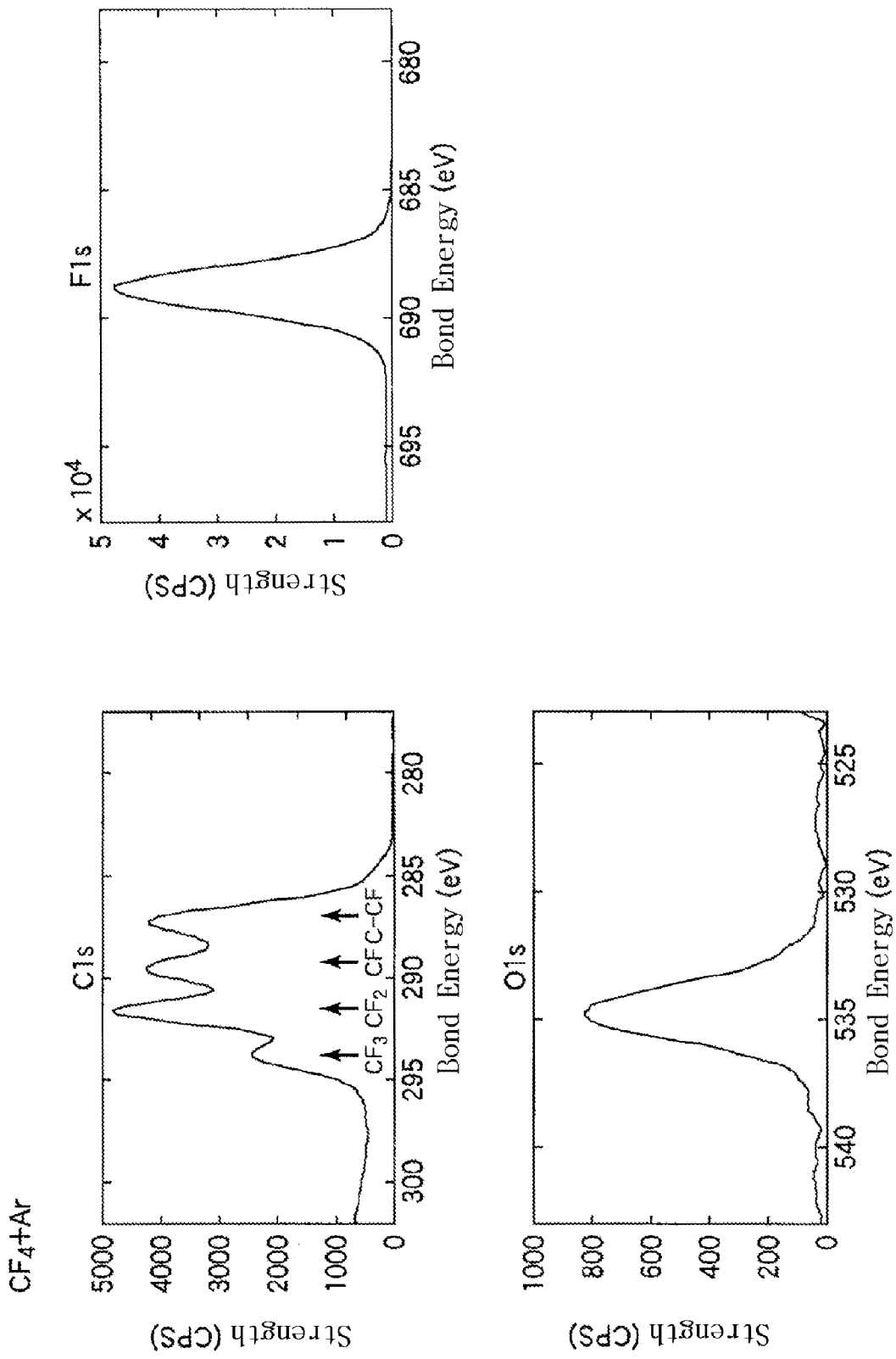
FIG. 25 illustrates an XPS profile of the case when the $CF_x$ film was etched by using a $CF_4$ gas and an Ar gas.
Figure 26:
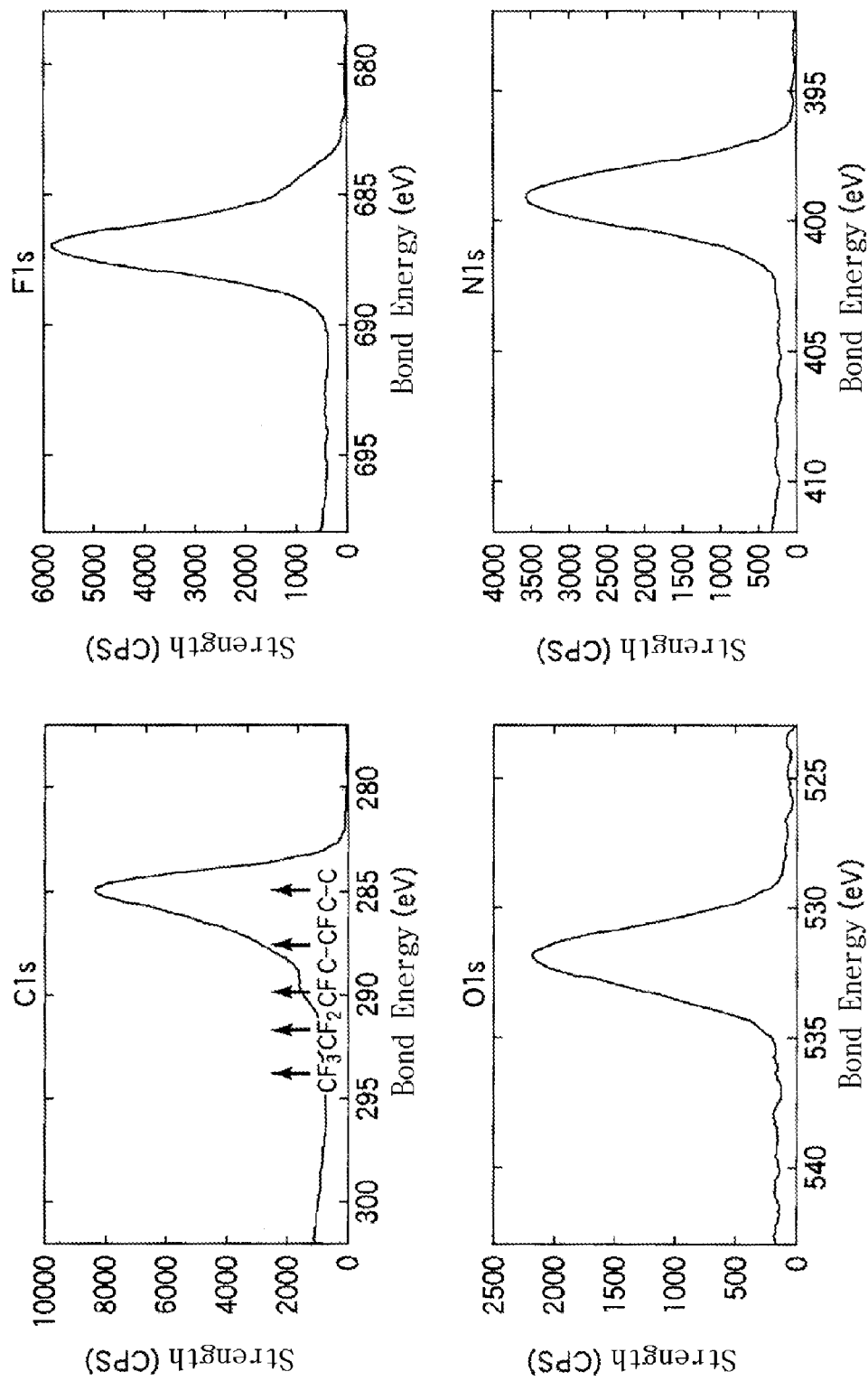
FIG. 26 illustrates an XPS profile of the case when the $CF_x$ film was etched by using a $H_2$ gas and a $N_2$ gas.
Figure 27:
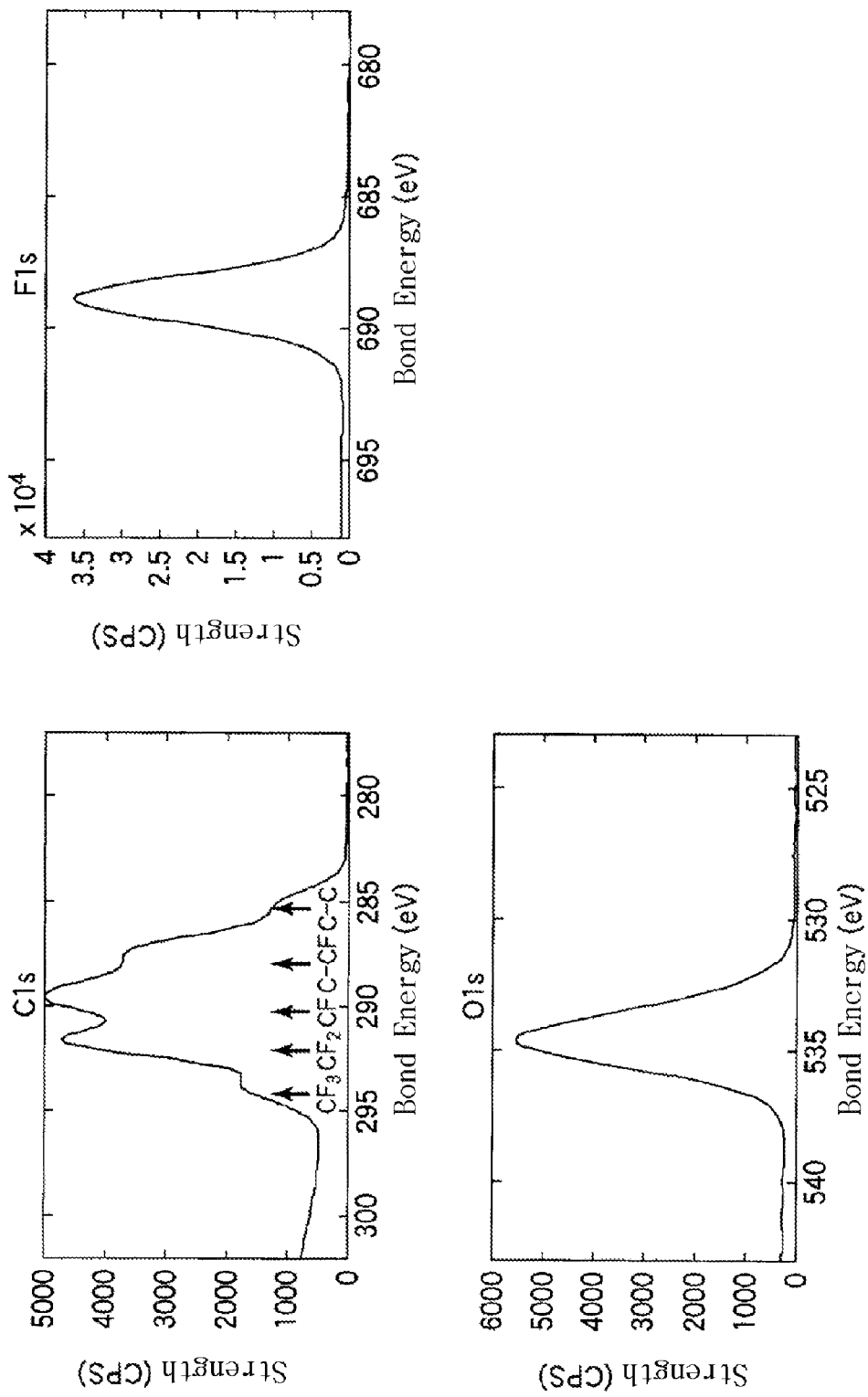
FIG. 27 illustrates an XPS profile of the case when the $CF_x$ film was etched by using an $O_2$ gas and an Ar gas.

Next, the $CF_x$ film was etched by using a processing gas indicated by the following three combinations: (1) $CF_4$ gas and Ar gas, (2) $H_2$ gas and $N_2$ gas, and (3) $O_2$ gas and Ar gas, respectively. Here, the $CF_x$ film was etched by using the plasma processing apparatus 200 of FIG. 16. In the case of (1) $CF_4$ gas and Ar gas, the $CF_x$ film was etched under standard conditions of flow rate: $CF_4$/Ar=200/200 mL/min(sccm), microwave power: 2 kW, bias: 250 W, pressure: 0.93 Pa (7 mTorr) and temperature of susceptor: 30° C., and in the case of (2) $H_2$ gas and $N_2$ gas, the $CF_x$ film was etched under conditions of flow rate: $H_2$/$N_2$=200/200 mL/min(sccm), microwave power: 2 kW, bias: 250 W, pressure: 2.66 Pa (20 mTorr) and temperature of susceptor: 30° C., and in the case of (3) $O_2$ gas and Ar gas, the $CF_x$ film was etched under conditions of flow rate: $O_2$/Ar=500/500 mL/min(sccm), microwave power: 2 kW, pressure: 106 Pa (800 mTorr) and 5.3 Pa (40 mTorr). First, surface analysis was performed by an X-ray photoelectron spectroscopy (XPS) on a sample on which etching was performed, and on a sample on which etching was not performed, respectively. FIG. 24 is an XPS profile of the $CF_x$ film before etching was performed, FIG. 25 is an XPS profile of the case when the $CF_x$ film was etched by using the $CF_4$ gas and the Ar gas, as in (1), FIG. 26 is an XPS profile of the case when the $CF_x$ film was etched by using the $H_2$ gas and the $N_2$ gas, as in (2), and FIG. 27 is an XPS profile of the case when the $CF_x$ film was etched by using the $O_2$ gas and the Ar gas, as in (3). The XPS profile was basically indicated with respect to carbon (C1s), oxygen (O1s), and fluorine (F1s). In the case of (2) $H_2$ gas and $N_2$ gas, the XPS profile was also indicated with respect to nitrogen (N1s). From the XPS profiles, the result of composition analysis is shown in Table 1.

TABLE 1

| | | XPS atmic % | | | |
|---|---|---|---|---|---|
| | | C1s | N1s | O1s | F1s |
| $CF_4$ + Ar | | 45.8 | — | 1.8 | 52.4 |
| $H_2$ + $N_2$ | | 67.2 | 15.0 | 6.4 | 11.4 |
| $O_2$ + Ar | 106 Pa | 50.5 | — | 11.3 | 38.3 |
| $O_2$ + Ar | 5.3 Pa | 48.2 | — | 10.5 | 41.3 |
| No etching | | 51.6 | — | 0.8 | 47.6 |

When etching was performed by using the $CF_4$ gas and the Ar gas, as in (1), as apparent from comparison of FIGS. 24 and 25, there was no large change in the XPS profile, and as shown in Table 1, the amount of F increased slightly, and composition was not changed as compared to that before etching, and the $CF_x$ film was stably maintained. Meanwhile, when etching was performed by using the $H_2$ gas and $N_2$ gas, as in (2), as apparent from comparison of FIGS. 24 and 26, the XPS profile was changed greatly, and as shown in Table 1, the amount of F decreased greatly, and N was added to the XPS profile, and the $CF_x$ film was damaged. In addition, when etching was performed by using the $O_2$ gas and the Ar gas, as in (3), as apparent from comparison of FIGS. 24 and 27, there was no large change in the XPS profile, and as shown in Table 1, there was no large change in rates of C and F, and the $CF_x$ film was stably maintained, but the amount of oxygen that remains on the surface of the $CF_x$ film increased.

Figure 28:
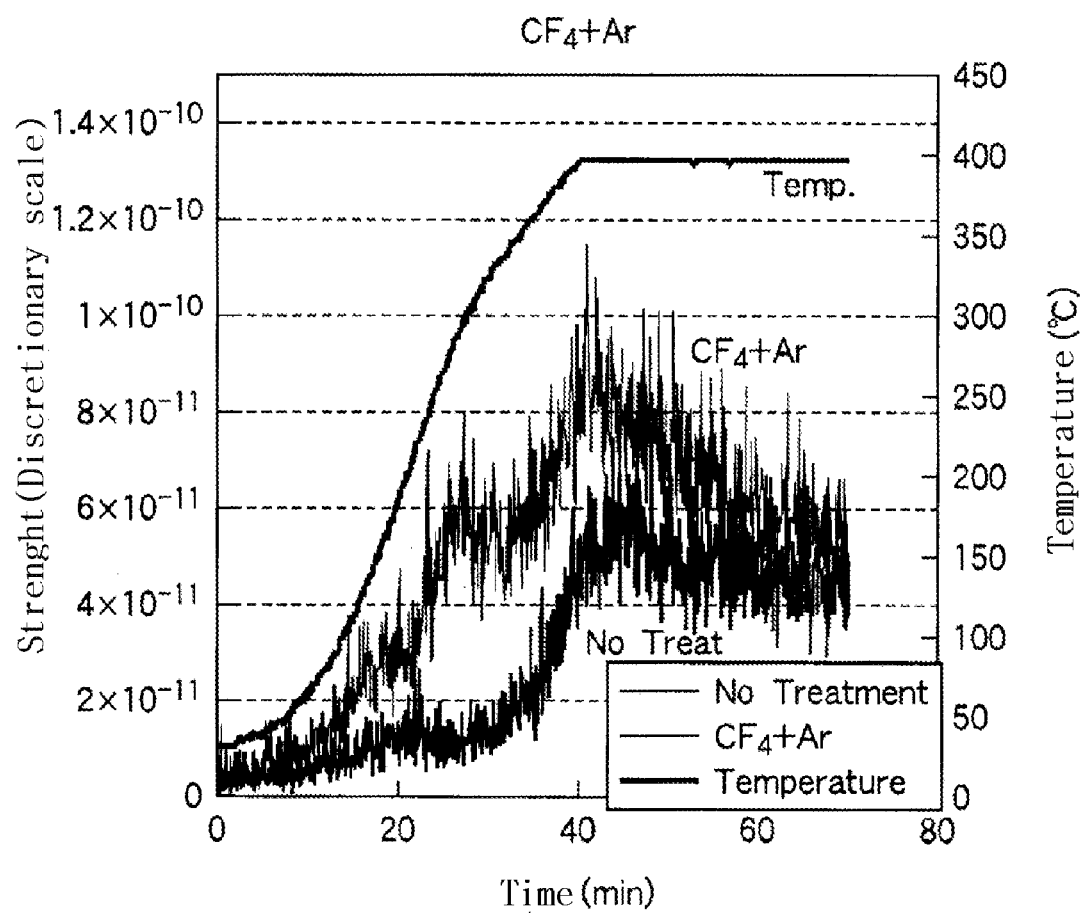
FIG. 28 illustrates a TDS profile that shows discharge of F when the $CF_x$ film was etched by using a $CF_4$ gas and an Ar gas and then temperature increased to 400° C.
Figure 29:
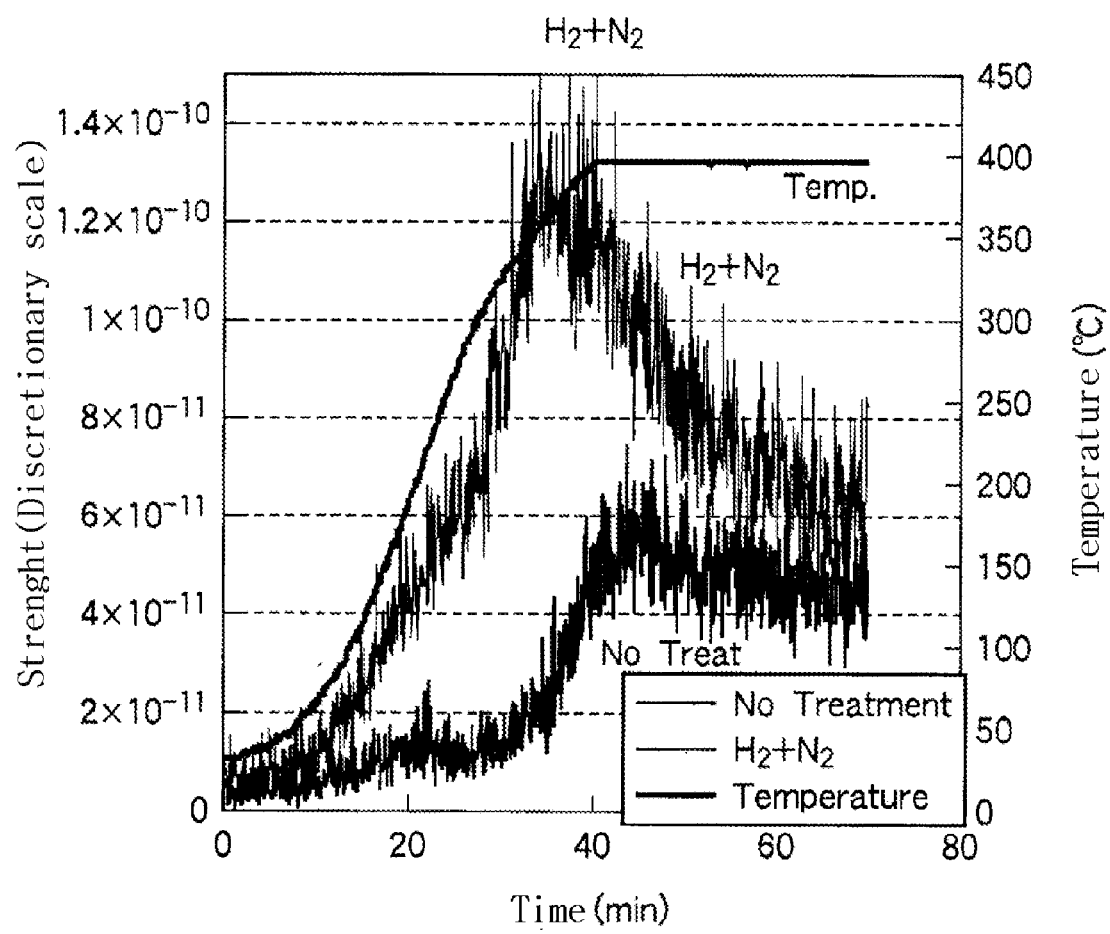
FIG. 29 illustrates a TDS profile that shows discharge of F when the $CF_x$ film was etched by using a $H_2$ gas and a $N_2$ gas and then temperature increased to 400° C.
Figure 30:
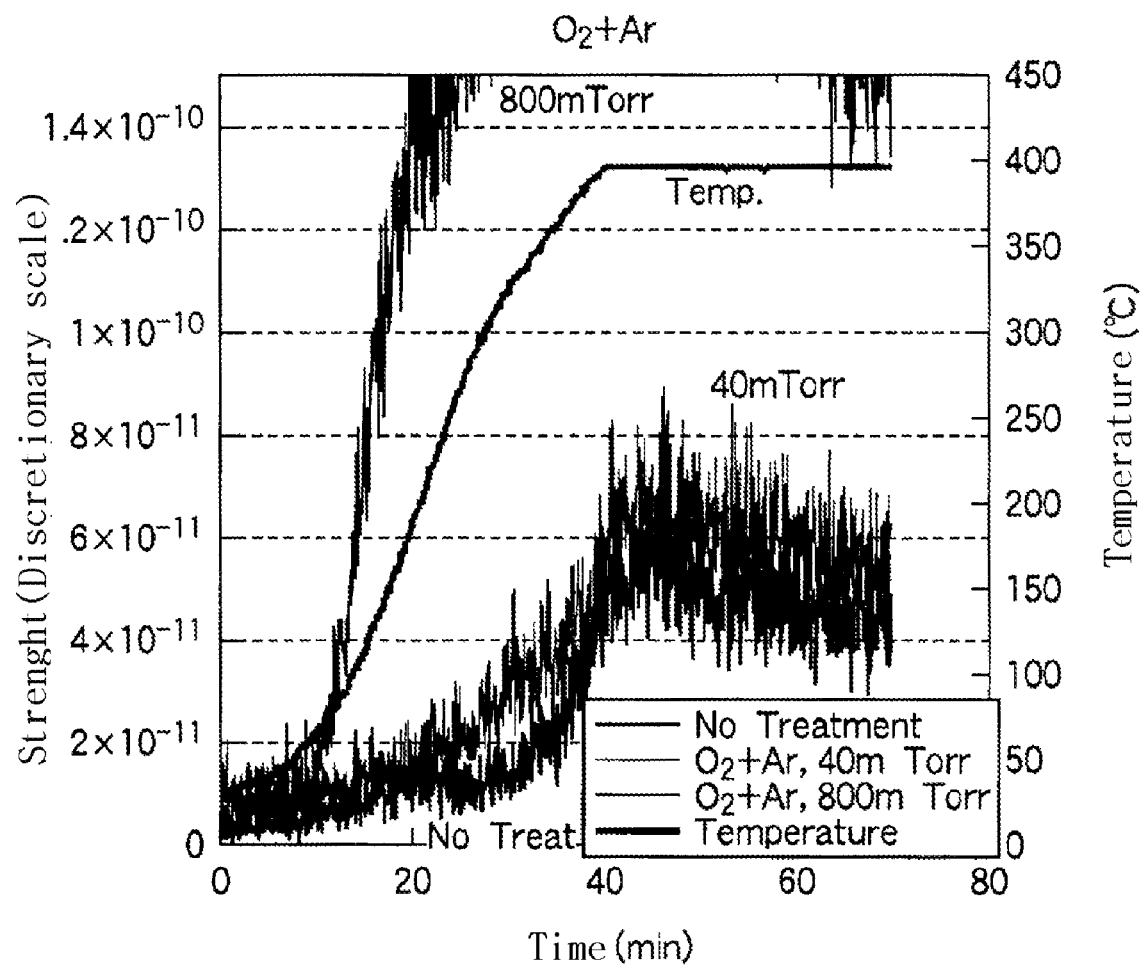
FIG. 30 illustrates a TDS profile that shows discharge of F when the $CF_x$ film was etched by using an $O_2$ gas and an Ar gas and then temperature increased to 400° C.

Next, it was ascertained by TDS that F was separated from the sample in which etching was performed by using the cases (1), (2), and (3) when temperature increased to 400° C. The result thereof is shown in FIGS. 28 through 30. FIG. 28 is a graph showing the case when etching was performed by using the $CF_4$ gas and the Ar gas, as in (1), and FIG. 29 is a graph showing the case when etching was performed by using the $H_2$ gas and the $N_2$ gas, as in (2), and FIG. 30 is a graph showing the case when etching was performed by using the $O_2$ gas and the Ar gas, as in (3). As shown in FIGS. 28 through 30, when etching was performed by using the $CF_4$ gas and the Ar gas, as in (1), there was no large change in the amount of F discharged, between a sample in which etching was performed by using the $CF_4$ gas and the Ar gas and a sample in which etching was not performed (indicated by line of "No Treatment"), and when etching was performed by using the $H_2$ gas and the $N_2$ gas, as in (2), the amount of F discharged, increased as compared to the sample in which etching was not performed, and when etching was performed by using the $O_2$ gas and the Ar gas, as in (3), and pressure was 5.3 Pa (40 mTorr), there was no large change in the amount of F discharged, as compared to the sample in which etching was not performed, and when pressure was 106 Pa (800 mTorr), discharge of F was observed.

It is considered from the result of etching using the above-described gases that, when the first step of etching the $CF_x$ film was performed by using an $O_2$-containing gas and then the second step of etching the $CF_x$ film was performed by using a $CF_4$-containing gas, the $CF_x$ film was not greatly damaged. In addition, it was ascertained that considering discharge of F, it was important that the first step of etching the $CF_x$ film using the $O_2$-containing gas was performed in a low-pressure area (specifically, 13.3 Pa (100 mTorr) or less) in which etching by ions other than radicals was dominant.

While this invention has been particularly shown and described with reference to exemplary embodiments thereof, it will be understood by those of ordinary skill in the art that various changes in form and details may be made therein without departing from the spirit and scope of the invention as defined by the appended claims. For example, in the embodiments, etching is performed by capacity-coupled plasma generated by a parallel flat plasma processing apparatus and by plasma generated by microwaves radiated from a planar antenna having a plurality of slots but the present invention is not limited to this.

In addition, first and second steps of etching a $CF_x$ film may be performed by separate plasma source, and for example, the first step of etching the $CF_x$ film may be performed by parallel flat capacity-coupled plasma, and the second step of etching the $CF_x$ film may be performed by plasma generated by the microwaves radiated from the planar antenna having the plurality of slots.

INDUSTRIAL APPLICABILITY

In an etching method and a recording medium according to the present invention, since a fluorine-added carbon film ($CF_x$ film) may be etched with a better shape forming property without being damaged, the etching method and the recording medium according to the present invention are effective for using the $CF_x$ film as a low-permittivity interlayer dielectric film (Low-k) and for manufacturing a semiconductor device in a multi-wiring structure having a Cu wiring layer by a damascene process.

The invention claimed is:

1. An etching method by which a fluorine-added carbon film of a structure in which a copper (Cu) wiring layer and the fluorine-added carbon film are sequentially formed on a semiconductor substrate, is etched, the etching method comprising:

performing first etching on the fluorine-added carbon film by using an etching mask;

forming a silicon-based coating film on the fluorine-added carbon film to fill an etched portion of the fluorine-added carbon film after the first etching is performed;

forming an etching mask on the silicon-based coating film and performing second etching on the fluorine-added carbon film by using the etching mask; and removing the silicon-based coating film, wherein the above operations are performed so that trenches and vias that reach a position corresponding to the Cu wiring layer are formed in the fluorine-added carbon film, and wherein the first etching and the second etching each comprise:

a first step of etching the fluorine-added carbon film with plasma of an oxygen-containing processing gas; and a second step of etching the fluorine-added carbon film with plasma of a fluorine-containing processing gas.

2. The method of claim 1, before the forming the silicon-based coating film, further comprising coating a wetting property enhancement surface reforming material on a surface of the fluorine-added carbon film after the first etching is performed, the wetting property enhancement surface reforming material reforming the surface of the fluorine-added carbon film to enhance a wetting property between the fluorine-added carbon film and the silicon-based coating film and to obtain a better close-adhesion property thereof.

3. The method of claim 2, wherein acetone is used as the wetting property enhancement surface reforming material.

4. The method of claim 1, further comprising, after the trenches and the vias are formed, coating a fluorine separation inhibition surface reforming material on a surface of inner walls of the fluorine-added carbon film, the fluorine separation inhibition surface reforming material reforming the surface of the fluorine-added carbon film to inhibit the amount of fluorine from the fluorine-added carbon film.

5. The method of claim 4, wherein ethanol or methanol is used as the fluorine separation inhibition surface reforming material.

6. The method of claim 1, further comprising, after the trenches and the vias are formed and after the Cu wiring layer is exposed, removing a native oxide film formed on the surface of the Cu wiring layer by supplying ammonia water to the surface of the Cu wiring layer.

7. The method of claim 6, wherein a concentration of ammonia of the ammonia water is 0.25 wt % to 5 wt %.

8. The method of claim 6, wherein a temperature of the ammonia water is 0° C. to 30° C.

9. The method of claim 1, wherein the trenches are formed by the first etching and the vias are formed by the second etching.

* * * * *